US009768172B2

(12) United States Patent
Okagaki

(10) Patent No.: US 9,768,172 B2
(45) Date of Patent: Sep. 19, 2017

(54) SEMICONDUCTOR DEVICE WITH SERIES CONNECTED INVERTERS HAVING DIFFERENT NUMBER OF ACTIVE REGIONS

(71) Applicant: Renesas Electronics Corporation, Koutou-ku, Tokyo (JP)

(72) Inventor: Takeshi Okagaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/049,127

(22) Filed: Feb. 21, 2016

(65) Prior Publication Data

US 2016/0284707 A1    Sep. 29, 2016

(30) Foreign Application Priority Data

Mar. 23, 2015   (JP) .................................. 2015-059529

(51) Int. Cl.
| | | |
|---|---|---|
| *H01L 27/092* | (2006.01) | |
| *H01L 27/02* | (2006.01) | |
| *H01L 23/522* | (2006.01) | |
| *H01L 23/528* | (2006.01) | |

(Continued)

(52) U.S. Cl.
CPC ........ *H01L 27/0924* (2013.01); *H01L 23/528* (2013.01); *H01L 23/5226* (2013.01); *H01L 27/0207* (2013.01); *H01L 29/0657* (2013.01); *H03K 5/134* (2014.07)

(58) Field of Classification Search
CPC ............. H01L 27/0924; H01L 23/5226; H01L 23/528; H01L 27/0207; H01L 29/0657; H03K 5/134
See application file for complete search history.

(56) References Cited

U.S. PATENT DOCUMENTS

| | | | |
|---|---|---|---|
| 5,229,667 A | 7/1993 | Shimizu | |
| 7,531,836 B2 * | 5/2009 | Liu ..................... | G01R 31/2642 257/299 |
| 2008/0191769 A1 | 8/2008 | Uemura et al. | |

(Continued)

FOREIGN PATENT DOCUMENTS

WO    WO 2006/132172 A1    12/2006

OTHER PUBLICATIONS

Tawfik, Sherif A., et al., "Mutual Exploration of FinFET Technology and Circuit Design Options for Implementing Compact Brute-Force Latches", IEEE, 1st Asia Symposium on Quality Electronic Design, Jul. 15, 2009, ISBN: 978-1-4244-4952-1.

(Continued)

*Primary Examiner* — Peter Bradford
(74) *Attorney, Agent, or Firm* — Shapiro, Gabor and Rosenberger, PLLC

(57) ABSTRACT

The semiconductor device includes a first inverter and a second inverter which is connected thereto in series. Each of the first and the second inverters includes a p-channel transistor and an n-channel transistor, respectively. The number of projection semiconductor layers each as the active region of the p-channel and the transistors of the second inserter is smaller than the number of the projection semiconductor layers each as the active region of the p-channel and the n-channel transistors of the first inverter.

21 Claims, 29 Drawing Sheets

(51) Int. Cl.
*H01L 29/06* (2006.01)
*H03K 5/134* (2014.01)

(56) References Cited

U.S. PATENT DOCUMENTS

| | | |
|---|---|---|
| 2009/0134454 A1 | 5/2009 | Takeuchi et al. |
| 2011/0018096 A1 | 1/2011 | Izumi et al. |
| 2015/0255461 A1* | 9/2015 | Chintarlapalli Reddy ............... H01L 27/0924 257/369 |

OTHER PUBLICATIONS

Munson, Philip M., et al., "A Performance-Power Evaluation of FinFET Flip-Flops under Process Variations", IEEE 54$^{th}$ International Midwest Symposium on Circuits and Systems, Aug. 7, 2011, ISBN: 978-1-61284-856-3.

Extended European Search Report issued Aug. 3, 2016, in European Patent Application No. EP16158030.3.

* cited by examiner

SEMICONDUCTOR DEVICE WITH SERIES CONNECTED INVERTERS HAVING DIFFERENT NUMBER OF ACTIVE REGIONS

CLAIM OF PRIORITY

The present application, claims priority from Japanese patent application JP2015-59529 filed on Mar. 23, 2015, the content of which is hereby incorporated by reference into this application.

BACKGROUND

The present invention relates to a semiconductor device which is applicable to a delay inverter circuit for FinFET, for example.

Aiming at suppressing the short channel effect in association with micronization, WO2006/132172 proposes the field effect transistor (hereinafter referred to as fin type field effect transistor, FinFET for short) which is configured to have a projection semiconductor layer projecting upward from a substrate plane, and form a channel region on both planes (both side surfaces) substantially perpendicular at least to the substrate plane of the projection semiconductor layer. The FinFET is produced by forming the three-dimensional structure on the two-dimensional substrate. The gate volume of the FinFET will be larger than that of the planar type transistor so long as the substrate has the same area. As the gate is configured to "envelope"the channel, the resultant channel controllability of the gate is high, and the leak current in the state where the device is in OFF state may be significantly reduced. Therefore, the threshold voltage may be set to be lower, resulting in optimum switching speed and energy consumption.

SUMMARY

The present invention provides delay circuit suitable for the FinFET.

The disclosure of the present invention will be briefly explained as follows.

The semiconductor device includes a first inverter and a second inverter connected thereto in series. Each of the first and the second inverters includes a p-channel transistor and an n-channel transistor, respectively. The number of projection semiconductor layers which constitute active regions of the p-channel and the n-channel transistors of the second inverter is smaller than the number of projection semiconductor layers which constitute active regions of the p-channel and the n-channel transistors of the first inverter.

The above-structured semiconductor device is enabled to constitute the optimum delay circuit.

BRIEF DESCRIPTION OF THE DRAWINGS

FIG. 12C is a sectional view taken along line M'-M" of FIG. 11B; and

DESCRIPTION OF THE PREFERRED EMBODIMENTS

Figure 1A:
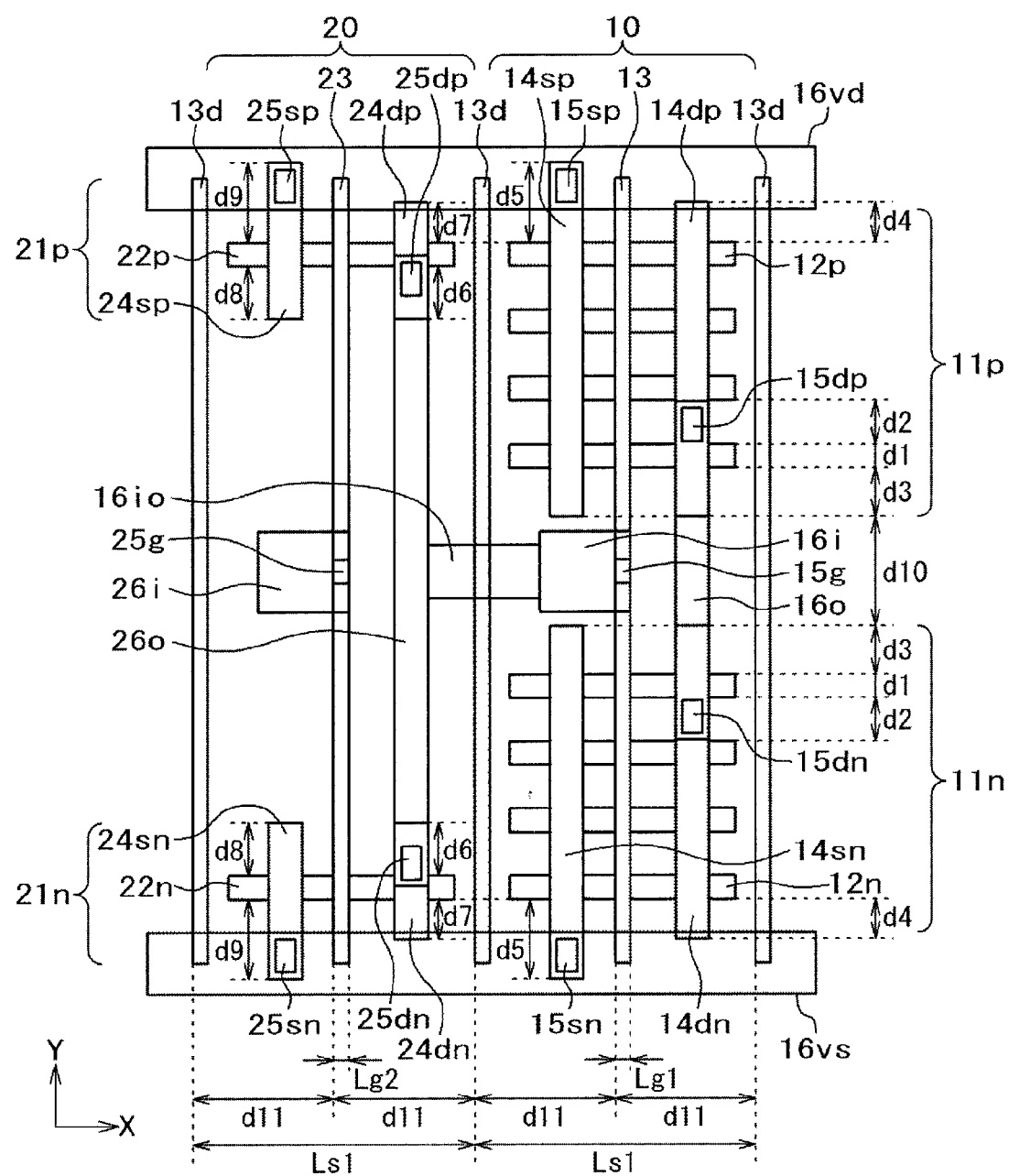
FIG. 1A is a plan view for explaining a semiconductor device according to a first embodiment.

An aspect of the present invention will be described together with embodiments referring to the drawings. In the following description, the same components are designated with the same codes, and explanations thereof, thus will be omitted. The drawings may be schematically illustrated with respect to width, thickness, configuration and the like of the respective components in comparison with the actual mode for clear understanding. It is to be understood that the description represents one of examples, which is not intended to restrict interpretation of the present invention.

Figure 13:
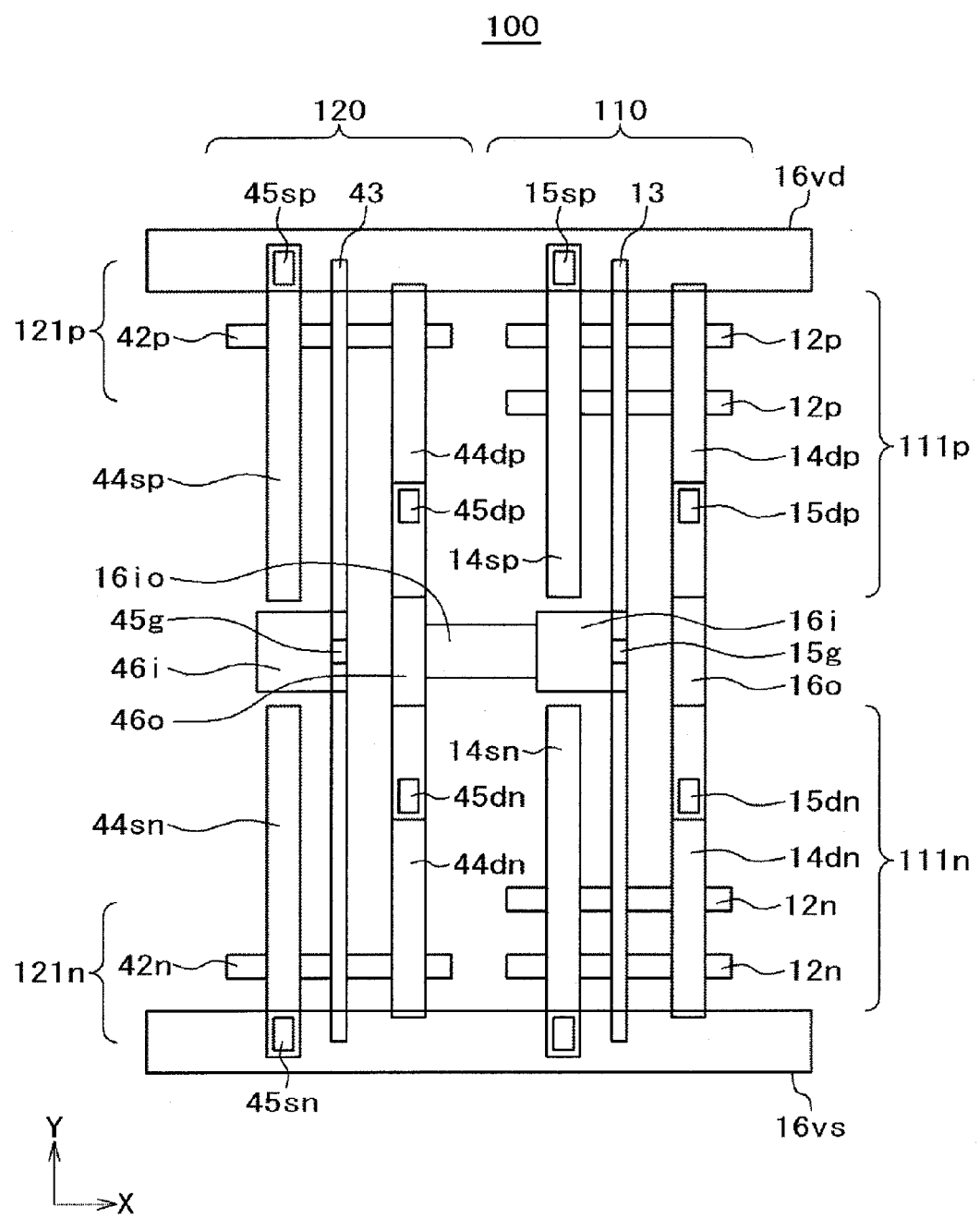
FIG. 13 is a plan view for explaining a semiconductor device according to an aspect of the present invention.

A semiconductor device according to the aspect of the present invention will be described referring to FIG. 13. FIG. 13 is a plan view of the semiconductor device according to the aspect of the present invention.

A semiconductor device 100 according to the aspect of the invention includes a first inverter 110, and a second inverter 120 connected to the first inverter 110 in series.

The first inverter 110 includes a first p-channel transistor 111*p* and a first n-channel transistor 111*n*. The second inverter 120 includes a second p-channel transistor 121*p* and a second n-channel transistor 121*n*.

The first p-channel transistor 111*p* includes a first active region 12*p*, a first gate electrode 13, a first local connection wiring 14*sp*, and a second local connection wiring 14*dp*. The first active region 12*p* is in the form of a projection semiconductor layer, extending along a first (X) direction. The first gate electrode 13 extends along a second (Y) direction. The second local connection wiring 14*sn* which extends along the second direction is connected to a drain, side of the first active region.

The first n-channel transistor 111*n* includes a second active region 12*n*, the first gate electrode 13, a third local connection wiring 14*sn*, and a fourth local connection wiring 14*dn*. The second active region 12*n* is in the form of the projection semiconductor layer, extending along the first direction. The third local connection wiring 14*sn* extends along the second direction so as to be connected to a source side of the second active region 12*n*. The fourth local connection wiring 14*dn* extends along the second direction so as to be connected to a drain side of the second active region 12*n*.

The second p-channel transistor 121*p* includes a third active region 42*p*, a second gate electrode 43, a fifth local connection wiring 44*sp*, and a sixth local connection wiring 44*dp*. The third active region 42*p* is in the form of the projection semiconductor layer, extending along the first direction. The second gate electrode 43 extends along the second direction. The fifth local connection wiring 44*sp* extends along the second direction so as to be connected to a source side of the third active region 42*p*. The sixth local connection wiring 44*dp* extends along the second direction so as to be connected to a drain side of the third active region 42*p*.

The second n-channel transistor 121*n* includes a fourth active region 42*n*, the second gate electrode 43, a seventh local connection wiring 44*sn*, and an eighth local connection wiring 44*dn*. The fourth active region 42*n* is in the form of the projection semiconductor layer, extending along the first direction. The seventh local connection wiring 44*sn* extends along the second direction so as to be connected to a source side of the fourth active region 42*n*. The eighth local connection wiring 44*dn* extends along the second direction so as to be connected to a drain side of the fourth active region 42*n*.

The number of the third active regions 42*p* is smaller than the number of the first active regions 12*p*, and the number of the fourth active regions 42*n* is smaller than the number of the second active regions 12*n*.

The above-structured first and second inverters may constitute the delay circuit.

First Embodiment

Figure 1B:
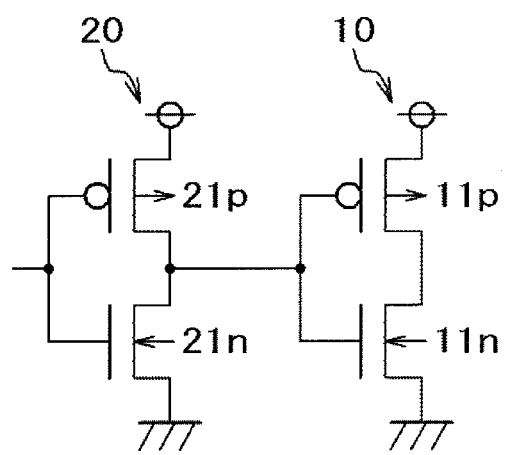
FIG. 1B is a circuit diagram for explaining the semiconductor device according to the first embodiment.

The semiconductor device according to a first embodiment will be described referring to FIGS. 1A and 1B. FIG. 1A is a plan view representing structure of the semiconductor device according to the first embodiment. FIG. 1B is a circuit diagram of the semiconductor device according to the first embodiment.

A semiconductor device 100A of the first embodiment is in the form of a delay circuit (buffer) constituted by an inverter circuit for the FinFET. The semiconductor device 100A is formed on a semiconductor substrate such as silicon (Si) through the process after 16 nm FinFET, for example.

As FIG. 1B shows, the semiconductor device 100A is structured by connecting inverters in two stages in series. A p-channel transistor (first p-channel transistor) 11*p* of an inverter (first inverter) 1 at the latter stage (output side) includes four active regions (first active regions) 12*p*, and a gate electrode (first gate electrode) 13 which crosses those regions. The p-channel transistor 11*p* includes a local interconnector (LIC or local connection wiring) 14*sp* for connecting four active regions at the source side, which are connected to a first power source metal wiring 16*vd*, and an LIC (second local connection wiring) 14*dp* for connecting the four active regions at the drain side. The active region 12*p* is constituted by a semiconductor layer (projection semiconductor layer) with Fin structure. The LIC is provided because of small width of the projection semiconductor layer in a planar view, which cannot allow formation of a via for connection to the upper layer metal wiring. Those four active regions 12*p* extend along X direction each in the strip-like form in a planar view. The gate electrode 13, the LIC (first local connection wiring) 14*sp*, and the LIC 14*dp* extend along Y direction each in the strip-like form in a planar view. The strip-like form basically has a thin rectangular shape, the respective long and short sides of which are not necessarily linear. Each of four corners of such form does not have to be a right angle, but may be rounded. The n-channel transistor (first n-channel transistor) 11*n* of the inverter 10 includes four active regions (second active regions) 12*n*, and the gate electrode 13 which crosses those regions. The n-channel transistor 11*n* includes the LIC (third local connection wiring) 14*an* for connecting the four active regions at the source side, which are connected to a second power source metal wiring 16*vs*, and the LIC (fourth local connection wiring) 14*dn* for connecting the four active regions at the drain side. The active region 12*n* is constituted by the projection semiconductor layer. The four active regions 12*n* extend along X direction each in the strip-like form in a planar view. The gate electrode 13 and an input metal wiring 16*i* are connected through a via 15*g*, and the LIC 14*dp* and an output metal wiring 16*o* are connected through a via 15*dp*. The LIC 14*dn* and the output metal wiring 16*o* are connected through a via 15*dn* so that the p-channel transistor 11*p* and the n-channel transistor 11*n* are connected. The number of the active regions 12*p* is not limited to four so long as it is larger than the number of the active regions 22*p*. The number of the active regions 12*n* is not limited to four so long as it is larger than the number of the active regions 22*n*. The number of the active regions 22*p* is not limited to one so long as it is smaller than the number of the active regions 12*p*. The number of the active regions 22*n* is not limited to one so long as it is smaller than the number of the active regions 12*n*.

The p-channel transistor (second p-channel transistor) 21*p* of the inverter (second inverter) 20 in the former stage (input side) includes an active region (third active region) 22*p* constituted by the projection semiconductor layer, and a gate electrode (second gate electrode) 23 which crosses the active region. The p-channel transistor 21*p* includes an LIC (fifth local connection wiring) 24*sp* for connecting the source side of the active region 22*p* and the first power source metal wiring 16*vd*, and an LIC (sixth local connection wiring) 24*dp* for connecting the drain side of the active region 22*p* and an output metal wiring 26*o*. The active region 22*p* extends along X direction in the strip-like form in a planar view. The gate electrode 23, the LIC 24*sp*, and the LIC 24*dp* extend along Y direction each in the strip-like form in a planar view. The n-channel transistor (second n-channel transistor) 21*n* of the inverter 2 includes the active region (fourth active region) 22*n* constituted by the projection semiconductor layer, and the gate electrode 23 which crosses the active region. The n-channel transistor 21*n* includes an LIC (seventh local connection wiring) 24*sn* for connecting the source side of the active region 22*n* and the second power source metal wiring 16*vs*, and an LIC (eighth local connection wiring) 24*dn* for connecting the drain side of the active region 22*n* and the output metal wiring 26*o*. The active region 22*n* extends along X direction in the strip-like form in a planar view. The gate electrode 23 and an input metal wiring 26*i* are connected through a via 25*g*, and the LIC 24*dp* and the output metal wiring 26*o* are connected through a via 25*dp*. The LIC 24*dn* and the output metal wiring 26*o* are connected through a via 25*dn* so that the p-channel transistor 21*p* and the n-channel transistor 21*n* are connected. A connection metal wiring 16*io* connects the output metal wiring 26*o* and the input metal wiring 16*i* so as to connect the inverters 20 and 10. The output metal wiring 26*o* extends along Y direction in the strip-like form in a planar view. The semiconductor device 100A includes dummy gate electrodes 13*d* each with the same size as the gate electrode 13 in the same layer. The dummy gate electrodes 13*d* are provided for uniform density of the gate electrode layer. The potential applied to the first power source metal wiring 16*vd* is higher than the one applied to the second power source metal wiring 16*vs*.

Each of the p-channel transistor 21*p* and the n-channel transistor 21*n* has one diffusion region. Each of the p-channel transistor 11*p* and the n-channel transistor 11*n* has four active regions. The following formulae are established.

$$Wg2 = 2 \times H_{FIN} + W_{FIN} \quad (1)$$

$$Wg1 = 4 \times (2 \times H_{FIN} + W_{FIN}) = 4 \times Wg2 \quad (2)$$

where $H_{FIN}$ denotes the height (fin height) of the projection semiconductor layer which constitutes the active region, $W_{FIN}$ denotes the width (fin width) of the projection semiconductor layer, Wg2 denotes each gate width of the p-channel transistor 21*p* and the n-channel transistor 21*n*, and Wg1 denotes each gate width of the p-channel transistor 11*p* and the n-channel transistor 11*n*.

The following formula is established.

$$Wg1/Lg1 = 4 \times Wg2/Lg1 \quad (3)$$
$$= 4 \times Wg2/Lg2 >$$
$$Wg2/Lg2$$

where Lg2 denotes each gate length (width of the gate electrode 23) of the p-channel transistor 21*p* and the n-channel transistor 21*n*, and Lg1 denotes each gate width (width of the gate electrode 13) of the p-channel transistor 11*p* and the n-channel transistor 11*n*, and the relationship of Lg1=Lg2 is established. In other words, the ratio of the gate width to each gate length of the p-channel transistor 21*p* and the n-channel transistor 21*n* (Wg2/Lg2) becomes smaller than the ratio of each gate width to each gate length of the p-channel transistor 11*p* and the n-channel transistor 11*n* (Wg1/Lg1).

The width ($W_{FIN}$) of the active region 12*p* in a planar view is defined as d1, and the distance between adjacent active regions 12*p* in a planar view is defined as d2. A distance between an end of the active region 12*p* at the side proximate to the n-channel transistor 11*n* and an end of the LIC 14*dp* at the side of the n-channel transistor 11*n* in a planar view is defined as d3, and a distance between an end of the active region 12*p* at the side proximate to the first power source metal wiring 16*vd*, and an end of the LIC 14*dp* at the side of the first power source metal wiring 16*vd* in a planar view is defined as d4. A distance between an end of the active region 12*p* at the side proximate to the n-channel transistor 11*n*, and an end of the LIC 14*sp* at the side of the n-channel transistor 11*n* in a planar view is defined as d3, and a distance between an end of the active region 12*p* at the side proximate to the first power source metal wiring 16*vd*, and an end of the LIC 14*sp* at the side of the first power source metal wiring 16*vd* in a planar view is defined as d5.

A width of the active region 12*n* in a planar view is defined as d1, and a distance between the adjacent active regions 12*n* in a planar view is defined as d2. A distance between an end of the active region 12*n* at the side proximate to the p-channel transistor 11*p*, and an end of the LIC 14*dn* at the side of the p-channel transistor 11*p* in a planar view is defined as d3, and a distance between an end of the active region 12*n* at the side proximate to the second power source metal wiring 16*vs*, and an end of the LIC 14*dn* at the side of the second power source metal wiring 16*vs* in a planar view is defined as d4. A distance between an end of the active region 12*n* at the side proximate to the p-channel transistor 11*p*, and an end of the LIC 14*sn* at the side of the p-channel transistor 11*p* in a planar view is defined as d3, and a distance between an end of the active region 12*n* at the side proximate to the second power source metal wiring 16*vs*, and an end of the LIC 14*sn* at the side of the second power source metal wiring 16*vs* in a planar view is defined as d5.

A width of the active region 22*p* in a planar view is defined as dl, a distance between an end of the active region 22*p* and an end of the LIC 24*dp* at the side of the n-channel transistor 11*n* in a planar view is defined as d6, and a distance between an end of the active region 22*p* and an end of the LIC 24*dp* at the side of the first power source metal wiring 16*vd* in a planar view is defined as d7. A distance between an end of the active region 22*p* and an end of the LIC 24*sp* at the side of the n-channel transistor 21*n* in a planar view is defined as d8, and a distance between an end of the active region 22*p* and an end of the LIC 24*sp* at the side of the first power source metal wiring 16*vd* in a planar view is defined as d9.

A width of the active region 22*n* in a planar view is defined as d1, a distance between an end of the active region 22*n* and an end of the LIC 24*dn* at the side of the p-channel transistor 11*p* in a planar view is defined as d6, and a distance between an end of the active region 22*n* and an end of the LIC 24*dn* at the side of the second cower source metal wiring 16*vs* in a planar view is defined as d7. A distance between an end of the active region 22*n* and an end of the LIC 24*sn* at the side of the p-channel transistor 21*p* in a planar view is defined as d8, and a distance between an end of the active region 22*n* and an end of the LIC 24*sn* at the side of the second power source metal wiring 16*vs* in a planar view is defined as d9.

Each interval between the LIC 14*dp* and the LIC 14*dn*, and between the LIC 14*sp* and the LIC 14*sn* is defined as d1.

The active region 22*p* is disposed on the same line with the active region 12*p* at the side proximate to the first power source metal wiring 16*vd* along X direction, and the active region 22*n* is disposed on the same line with the active region 12*n* at the side proximate to the second power source metal wiring 16*vs* along X direction. The resultant relationships will be expressed by the following formulae.

$$\text{Length of LIC } 24dp = d7 + d1 + d6 \quad (4)$$

$$\text{Length of LIC } 14dp = d4 + d1 + (N-1)(d1 + d2) + d3 \quad (5)$$

Length of LIC 24$sp$=$d9$+$d1$+$d8$ (6)

Length of LIC 14$sp$=$d5$+$d1$+($N$−1)($d1$+$d2$)+$d3$ (7)

$$d3=(d1+d2)/4 \quad (8)$$

where N denotes the number of the active regions of the p-channel transistor 11$p$ and the n-channel transistor 11$n$. N=4 is set in the case of the semiconductor device 1A where d6=d3, d7=d4, d8=d3, and d9=d4. For example, the d1 is about 10 nm long, and the d2 is about 40 nm long.

Assuming that a gate pitch (inter-gate-electrode distance+ gate length) is defined as d11, the resultant relationship will be expressed by the following formulae. For example, the d11 is approximately 90 nm long.

$$Ls1=2\times d11 \quad (9)$$

$$Lg1 \leq W_{LIC} \leq d11/2 \quad (10)$$

The semiconductor device 100A is in the form of the delay circuit (buffer) structured by connecting inverters in two stages in series, and configured to minimize the active regions (the number of projection semiconductor layers) of the inverter in the former stage for prolonging the delay time. The delay time may be prolonged by increasing difference in the number of the projection semiconductor layers of the inverters between the former stage and the latter stage because the time taken for charging and discharging the latter stage inverter becomes longer. Preferably, the number of the projection semiconductor layers of the latter stage inverter is maximized if the arrangement allows. This makes it possible to stabilize output signals of the delay circuit. The delay time may be reduced by enlarging the active region of the former stage inverter (the number of the projection semiconductor layers).

Second Embodiment

Figure 2:
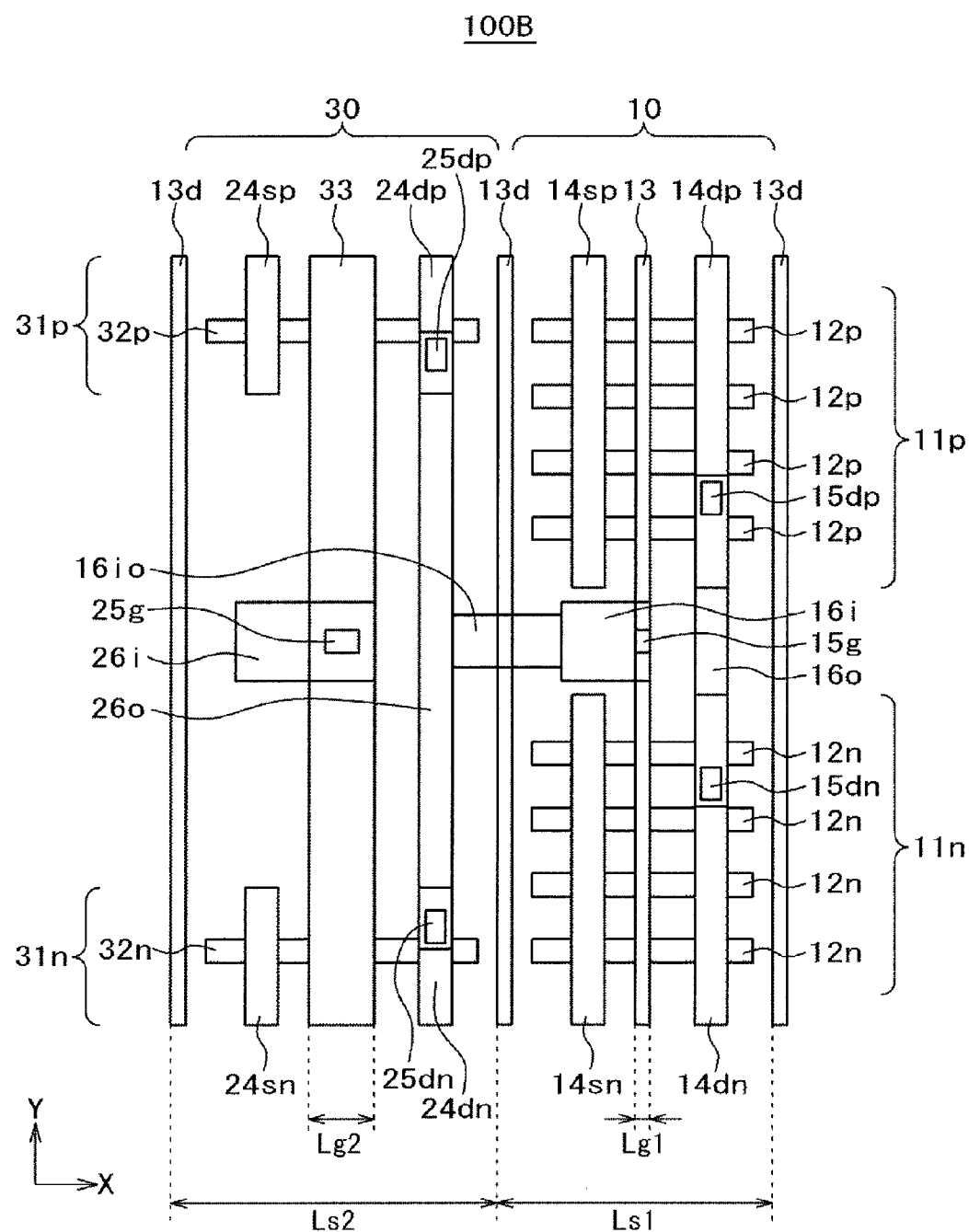
FIG. 2 is a plan view for explaining a semiconductor device according to a second embodiment.

A semiconductor device according to a second embodiment will be described referring to FIG. 2, which is configured to prolong the delay time longer than the semiconductor device 100A. FIG. 2 is a plan view representing structure of the semiconductor device according to the second embodiment.

Likewise the semiconductor device 100A according to the first embodiment as shown in FIG. 1B, a semiconductor device 100B according to the second embodiment is structured by connecting the inverters in two stages in series. The inverter 10 has the same structure as that of the inverter at the output side of the semiconductor device 100A. An inverter 30 in the former stage (input side) of the semiconductor device 100B is differently structured from the inverter 20 of the semiconductor device 100A. FIG. 2 omits description of the first power source metal wiring 16$vd$ and vias 15$sp$, 25$sp$ which are connected to the wiring, the second power source metal wiring 16$vs$, and vias 15$sn$, 25$sn$ which are connected to the wiring.

Each gate width (Wg2) of a p-channel transistor 31$p$ and an n-channel transistor 31$n$ is the same as each gate width (Wg2) of the p-channel transistor 21$p$ and the n-channel transistor 21$n$. However, the gate length (Lg2) of a gate electrode 33 is made longer than the Lg1 so as to prolong the delay time.

In order to prolong the delay time with good area efficiency, the gate length is adjusted to make the thick layout in reference to the minimum processing rule. This may increase the cell size in X direction correspondingly. Assuming that the cell size of the inverter 10 in X direction is defined as Ls1, and the cell size of the inverter 30 in X direction is defined as Ls2, the relationship of Ls2>Ls1 is established. Use of transistors each with different gate length in the same cell may cause dispersion in the delay time due to different characteristics between those transistors.

Third Embodiment

Figure 3A:
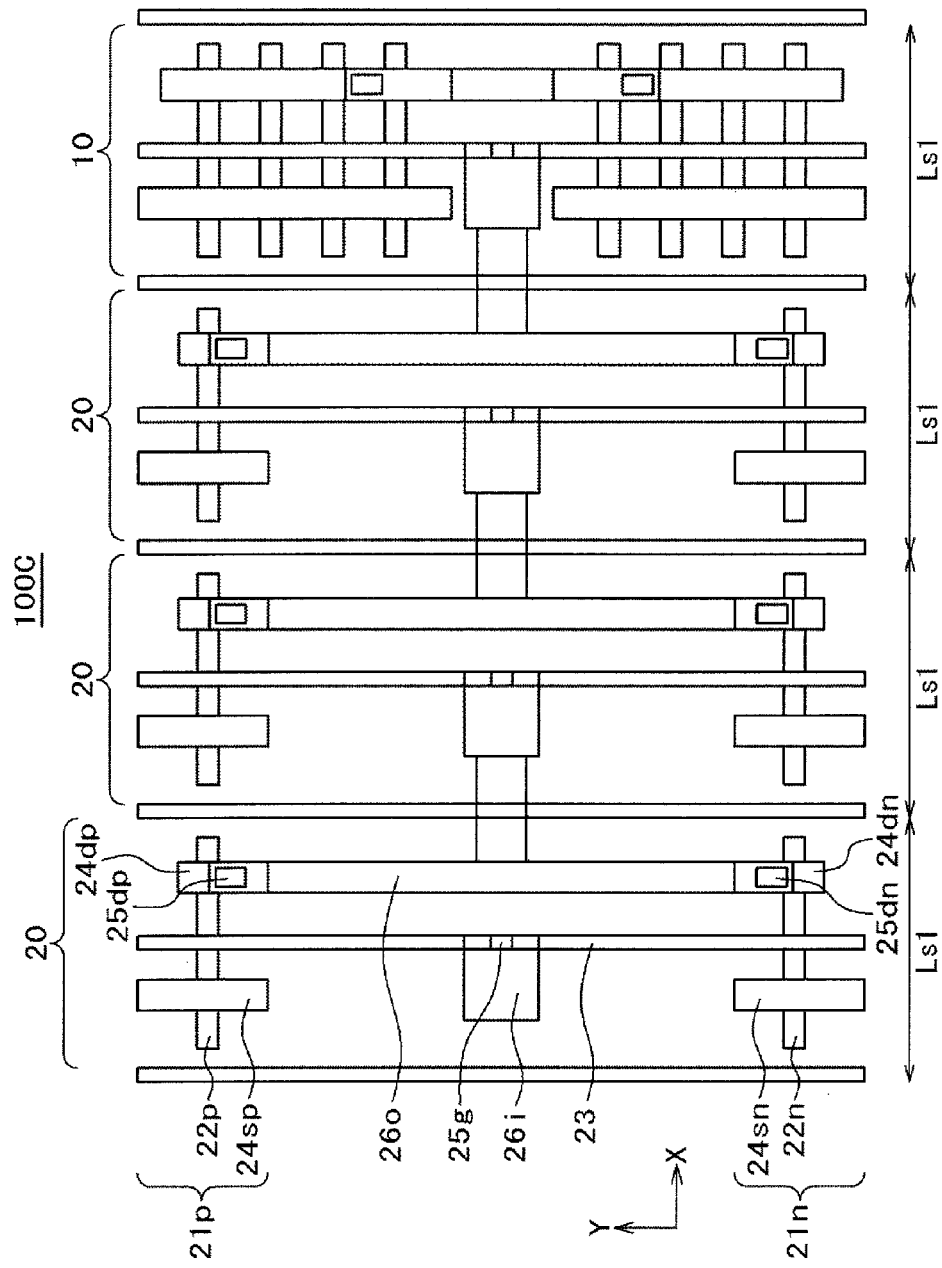
FIG. 3A is a plan view for explaining a semiconductor device according to a third embodiment.
Figure 3B:
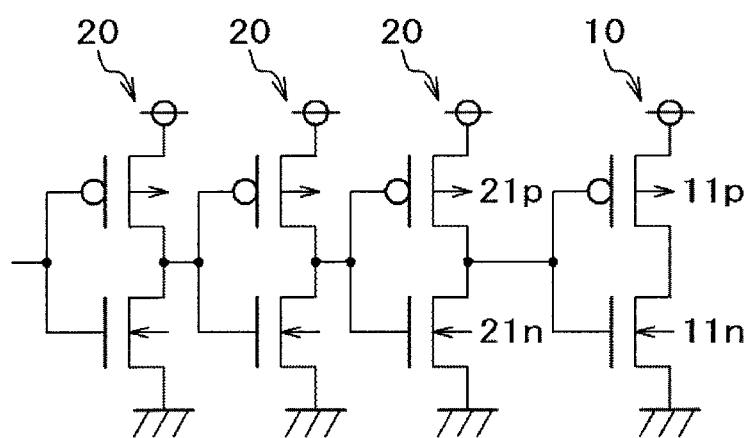
FIG. 3B is a circuit diagram for explaining the semiconductor device according to the third embodiment.

A semiconductor device according to a third embodiment will be described referring to FIGS. 3A and 3B, which employs transistors each with the same gate length for solving the problem of the device according to the second embodiment. FIG. 3A is a plan view representing structure of the semiconductor device according to the third embodiment. FIG. 3B is a circuit diagram of the semiconductor device according to the third embodiment.

As FIG. 3B shows, a semiconductor device 100C according to the third embodiment is structured by connecting inverters in four-stage cascade. The inverter 10 at output side is the same as the one used for the semiconductor device 100A. Each of the inverters 20 in three stages at input side is the same as the one used for the semiconductor device 100A. As each cell size of the inverters 10 and 20 in X direction is defined as Ls1, the cell size of the seed conductor device 100C is expressed as 4×Ls1. FIG. 3A omits description of the first power source metal wiring 16$vd$, the vias 15$sp$, 25$sp$ which are connected to the wiring, the second power source metal wiring 16$vs$, and the vias 15$sn$, 25$sn$ which are connected to the wiring. The semiconductor device 100C requires more transistors to prolong the delay time, leading to increase in the cell size in X direction.

Fourth Embodiment

Figure 4A:
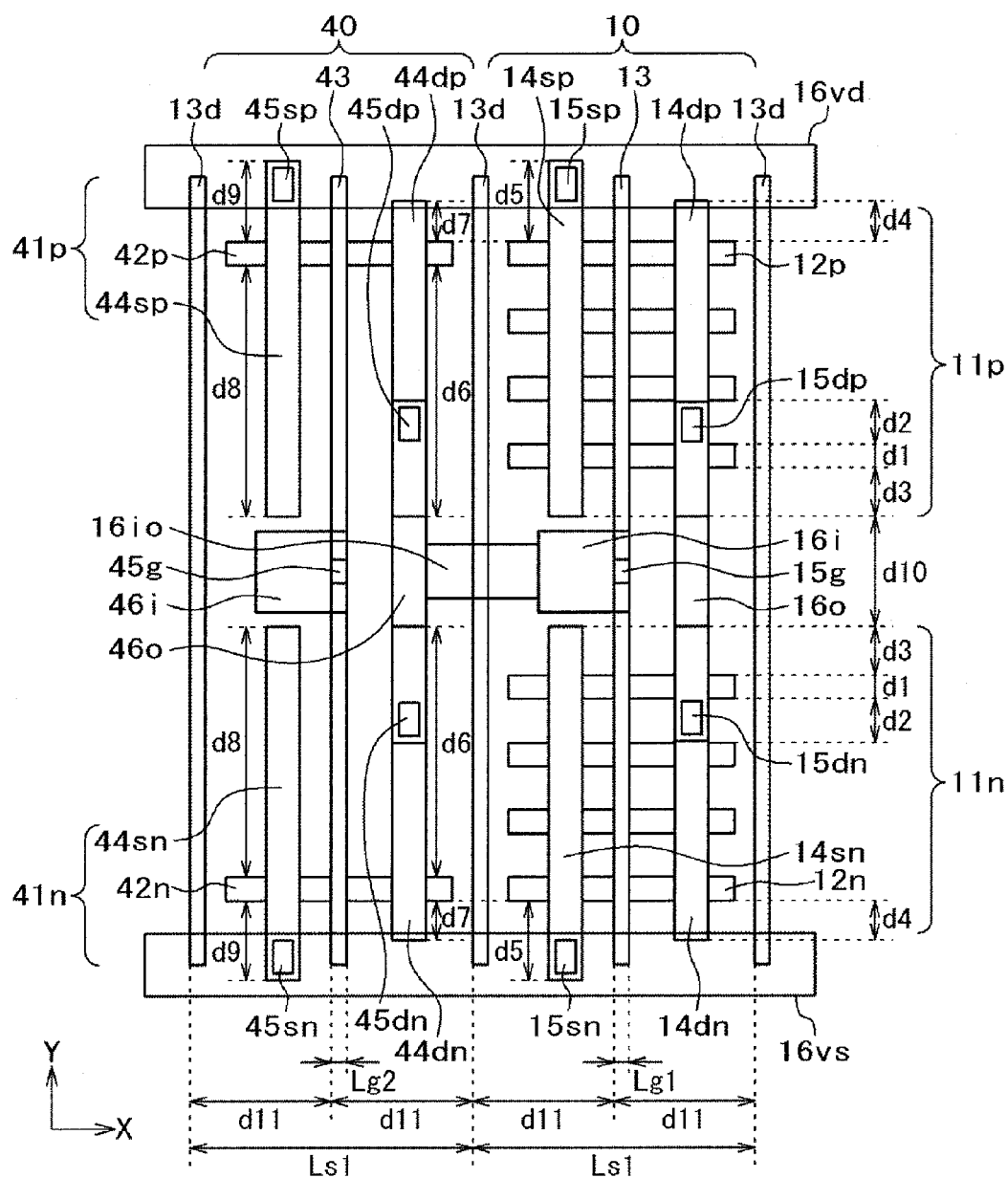
FIG. 4A is a plan view for explaining a semiconductor device according to a fourth embodiment.
Figure 4B:
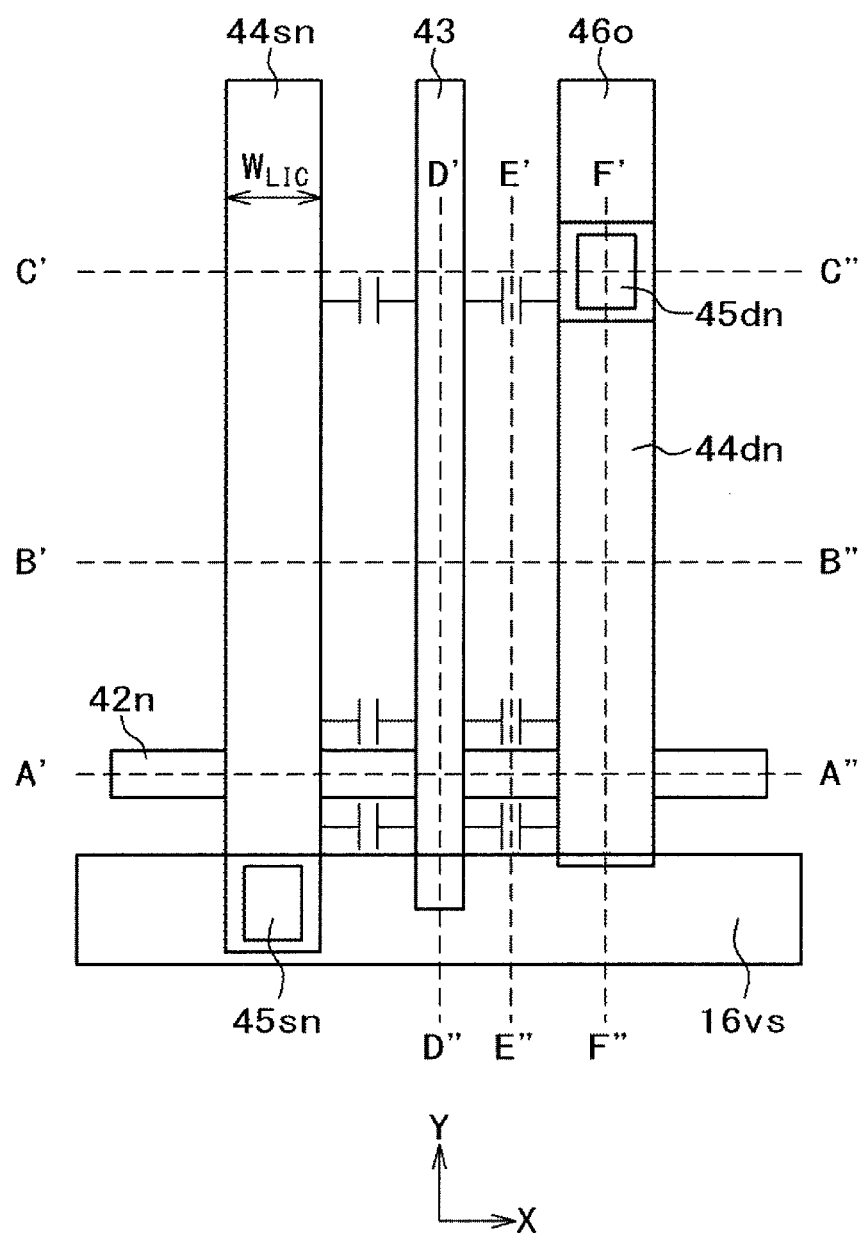
FIG. 4B is a plan view of an enlarged part of the structure shown in FIG. 4A.
Figure 5A:
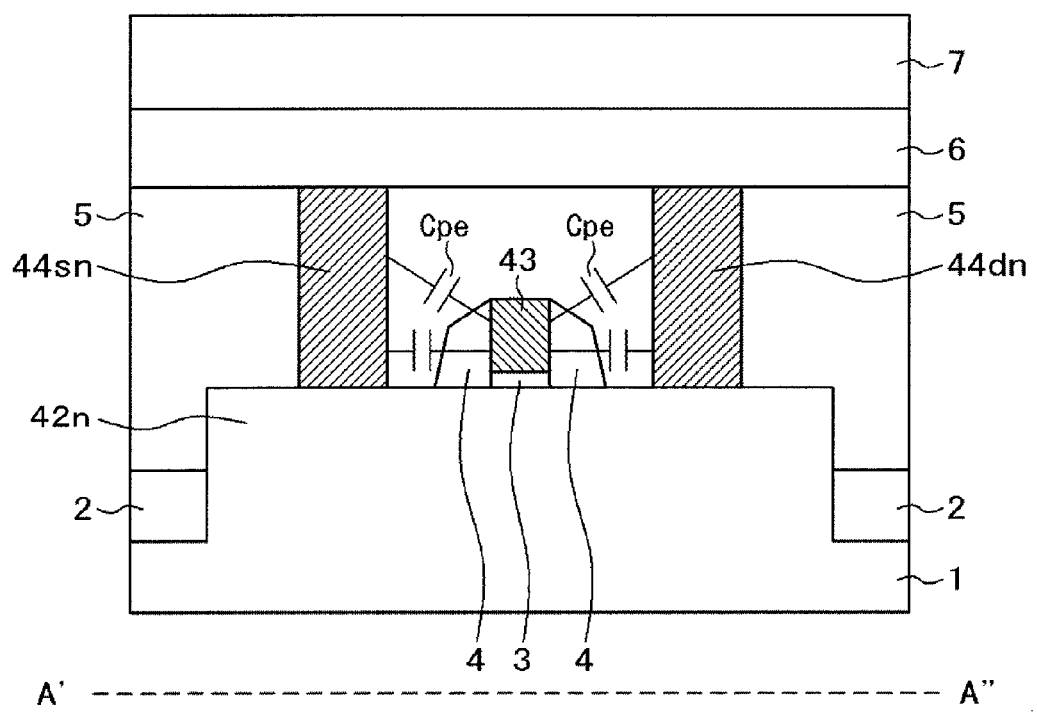
FIG. 5A is a sectional view taken, along line A'-A" of FIG. 4B.
Figure 5B:
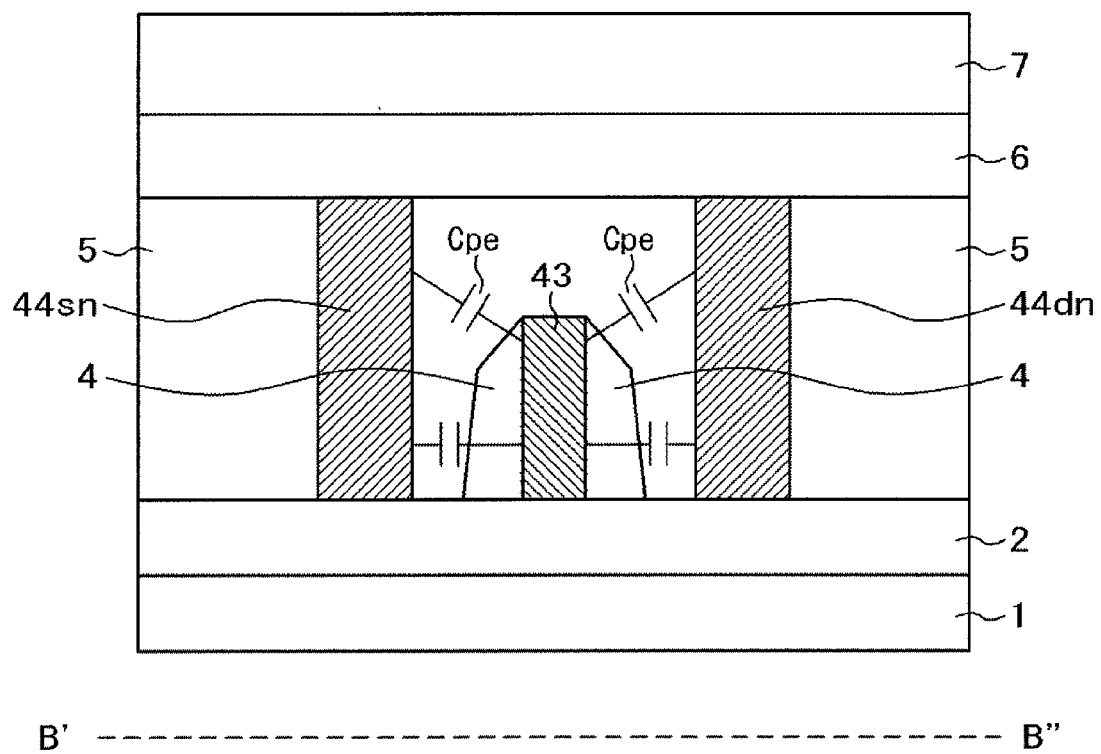
FIG. 5B is a sectional view taken along line B'-B" of FIG. 4B.
Figure 5C:
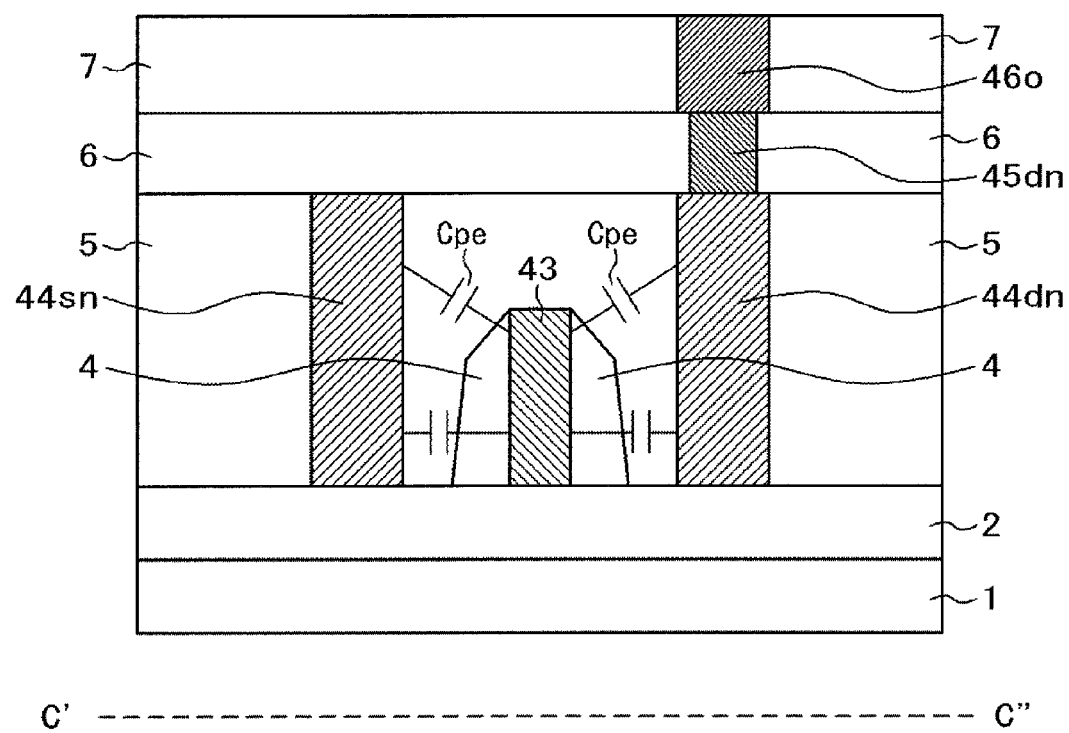
FIG. 5C is a sectional view taken along line C'-C" of FIG. 4B.
Figure 5D:
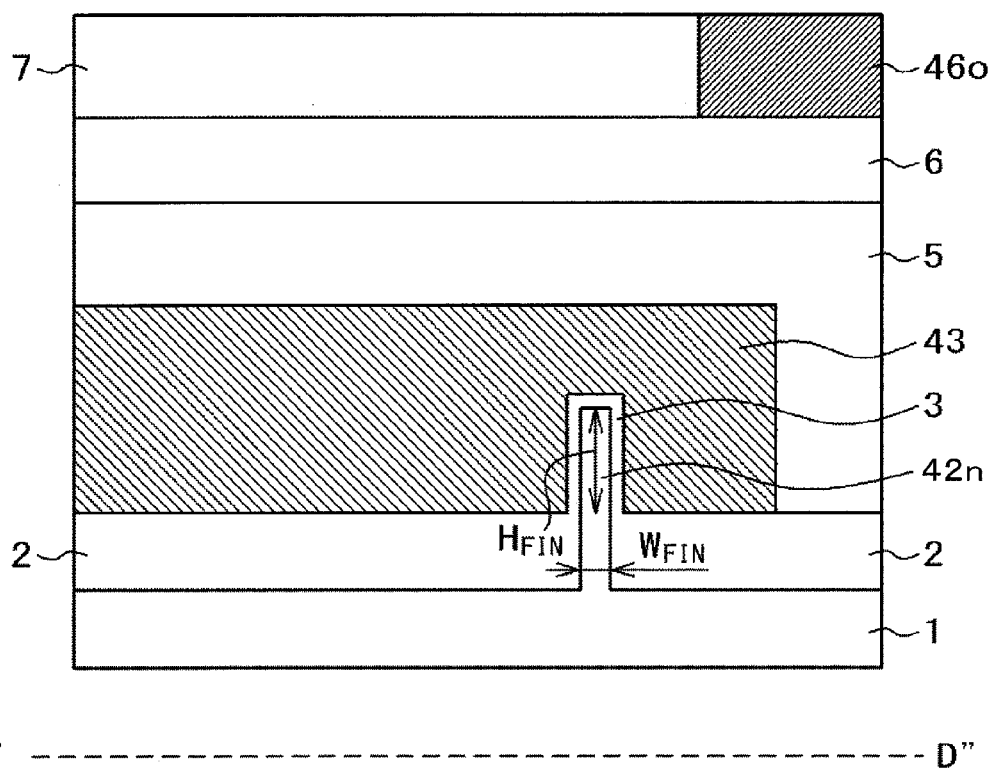
FIG. 5D is a sectional view taken along line D'-D" of FIG. 4B.
Figure 5E:
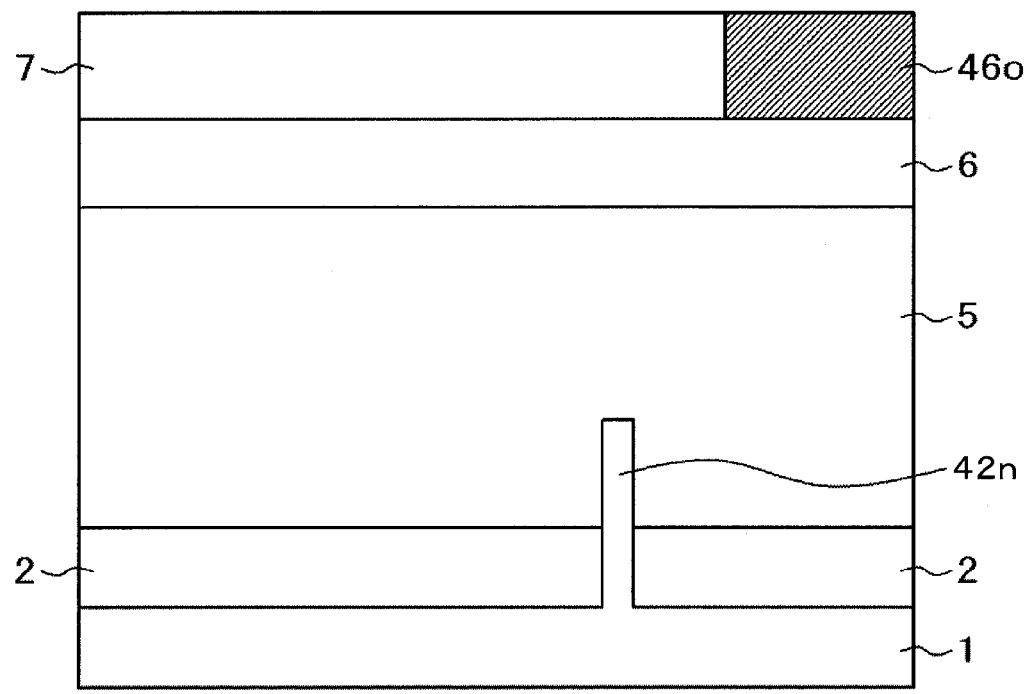
FIG. 5E is a sectional view taken along line E'-E" of FIG. 4B.
Figure 5F:
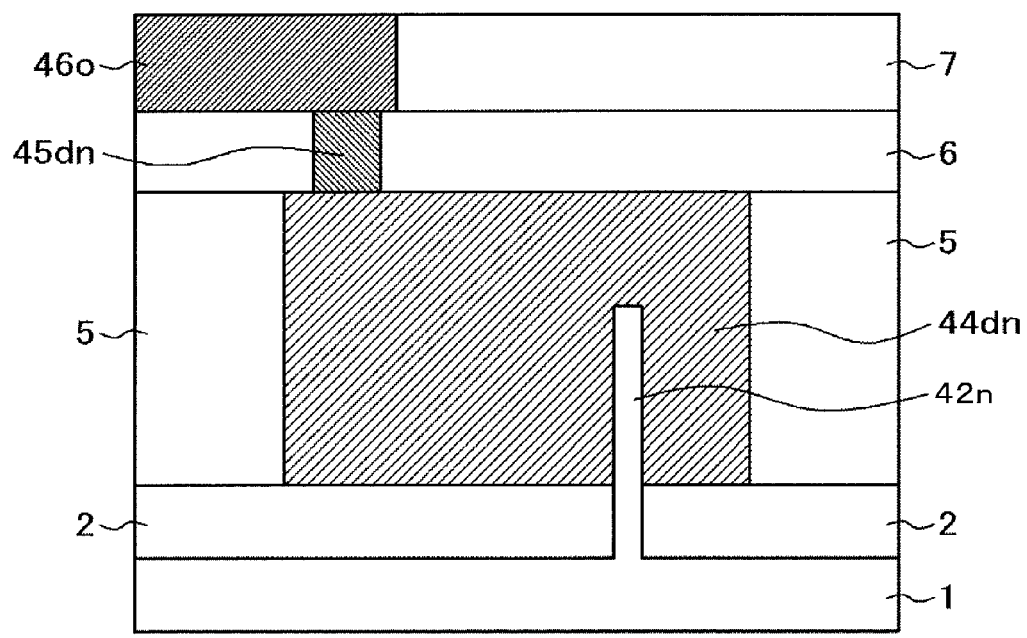
FIG. 5F is a sectional view taken along line F'-F" of FIG. 4B.

A semiconductor device according to a fourth embodiment will be described referring to FIGS. 4A, 4B, and 5A to 5F, which employs long LIC for solving the problems of the device according to the second and the third embodiments. FIG. 4A is a plan view representing structure of the semiconductor device according to the fourth embodiment. FIG. 4B is a plan view of an enlarged part of the structure as shown in FIG. 4A. FIG. 5A is a sectional view taken along line A'-A" of FIG. 4B. FIG. 5B is a sectional view taken along line B'-B" of FIG. 4B. FIG. 5C is a sectional view taken along line C'-C" of FIG. 4B. FIG. 5D is a sectional view taken along line D'-D" of FIG. 4B. FIG. 5E is a sectional view taken along line E'-E" of FIG. 4B. FIG. 5F is a sectional, view taken along line F'-F" of FIG. 4B.

Likewise the semiconductor device 100A according to the first embodiment as shown in FIG. 1B, a semiconductor device 100 according to the fourth embodiment is structured by connecting inverters in two stages in series. The inverter 10 of the semiconductor device 100D in the latter stage (output side) has the same structure as that of the inverter of the semiconductor device 100A. An to inserter (second, inverter) 40 of the semiconductor device 100D in the former stage (input side) basically has the same structure as that of the inverter 20 of the semiconductor device 100A except difference in each length of LIC 44$dp$, 44$dn$, and the output metal wiring 46$o$, and each position of vias 45$dp$, 45$dn$.

A width of an active region 42$p$ in a planar view is defined as d1, a distance between an end of the active region 42$p$ and an end of the LIC 44$dp$ at the side of the n-channel transistor (second n-channel translator) 41$n$ in a planar view is defined as and a distance between an end of the active region 42$p$ and an end of the LIC 44$dp$ at the side of the first power source metal wiring 16$vd$ in a planar view is defined as d7. A distance between an end of the active region 42$p$ and an end of the LIC 44$sp$ at the side of the n-channel transistor 41$n$ in a planar view is defined as d8, and a distance between an end of the active region 42$p$ and an end of the LIC 44$sp$ at the side of the first power source metal wiring 16$vd$ in a planar view is defined as d9.

A width of an active region 42n in a planar view is defined as d1, a distance between an end of the active region 42n and an end of the LIC 44dn at the side of the p-channel transistor 41p in a planar view is defined as and a distance between an end of the active region 42n and an end of the LIC 44dn at the side of the second power source metal wiring 16vs in a planar view is defined as d7. A distance between an end of the active region 42n end an end of the LIC 44sn at the side of the p-channel transistor (second p-channel transistor) 41p in a planar view is defined as d8, and a distance between an end of the active region 42n and an end of the LIC 44sn at the side of the second power source metal wiring 16vs in a planar view is defined as d9.

The active region 42p is disposed on the same line with the active region 12p at the side proximate to the first power source metal wiring 16vd in X direction, and the active region 42n is disposed on the same line with the active region 12n at the side proximate to the second power source metal wiring 16vs in X direction so that the relationship is expressed by the formula (4) to (10). In the case of the semiconductor device 100D, the relationships of d7=d4, d9=d5 are established. Furthermore, the LIC 14dp has the same length as that of the LIC 44dp, the LIC 14sp has the same length as that of the LIC 44sp, the LIC 14dn has the same length as that of the LIC 44dn, and the LIC 14sn has the same length as that of the LIC 44sn for establishing the following relationships.

$$d6=(N-1)(d1+d2)+d3 \quad (11)$$

$$d8=(N-1)(d1+d2)+d3 \quad (12)$$

In the case of the semiconductor device 100D, N=4 is set. Accordingly, the d6 becomes longer than the d3, and the d8 becomes longer than the d3, resulting in the length longer than the corresponding part of the semiconductor device 100A.

The number of the active regions 12p is not limited to four so long as it is larger than the number of the active regions 42p. The number of the active regions 12n is not limited to four so long as it is larger than the number of the active regions 42n. The number of the active regions 42p is not limited to one so long as it is smaller than the number of the active regions 12p. The number of the active regions 42n is not limited to one so long smaller than the number of the active regions 12n.

FIG. 4B is a plan view representing a part of the n-channel transistor 41n of the inverter 40 of the semiconductor device 100D at the input side. The structure of the aforementioned part will be described referring to FIGS. 5A to 5F. As each of the p-channel transistor 41p of the inverter 40 at the input side, the n-channel transistor 11n and the p-channel transistor 11p of the inverter 10 at the output side has the similar structure, explanations of such structure will be omitted.

As FIGS. 5A, 5D, 5E, 5F show, the active region 42n as the semiconductor layer partially projects from a semiconductor substrate 1 while piercing through an insulating film 2. In other words, the insulating film 2 constituting an element isolation region is formed on the semiconductor substrate 1 around the active region 42n. As FIG. 5D shows, a gate insulating film 3 is formed on both side surfaces, and upper surface of the active region 42n. Assuming that height and width of the active region 42n in contact with the gate insulating film 3 are defined as $H_{FIN}$ and $W_{FIN}$, respectively, the relationship of $H_{FIN} > W_{FIN}$ is established. For example, the $H_{FIN}$ may be 30 nm long, and the $W_{FIN}$ may be 10 nm wide, approximately. Referring to FIGS. 5A and 5D, the gate electrodes 43, 13 are formed in contact with the upper and side surfaces of the gate insulating film 3. Referring to FIGS. SB and 5C, the gate electrode 43 is formed on the insulating film 2. Referring to FIGS. 5A to 5C, side walls 4 each as the insulating film are formed at both sides of the gate electrode 43 in an extending direction. Referring to FIGS. 5A to 5F, an interlayer insulating film 5 is formed over the active region 42n, the insulating film 2, the gate electrode 43, and the side walls 4.

As FIGS. 5A, 5B, 5C and 5F show, the LIC 44sn and 44dn each made of the first metal film are formed on the upper and side surfaces of the active region 42n at the source and drain sides, and above the insulating film 2. In this way, the LIC 44sn is connected to the active region 42n at the source side, and the LIC 44dn is connected to the active region 42n at the drain side. The first metal film may be made from tungsten (W), for example.

As FIGS. 5A to 5F show, an interlayer insulating film 6 is formed on the interlayer insulating film 5, and the LIC 44sn, 44dn. As FIGS. 5C and 5F show, the via 45dn as the second metal film is formed on the LIC 44dn. The via 44dn is connected to the LIC 44dn, and the via 45sn is connected to the Lie 44sn.

As FIGS. 5A to 5F show, an interlayer insulating film 7 is formed on the interlayer insulating film 6 and the via 45dn. Referring to FIGS. 5C to 5F, the output metal wiring 46o as the third metal film and the second power source metal wiring 16vs are formed on the via 45dn and the interlayer insulating film 6. The via 45dn is connected to the output metal wiring 46o, and the via 45sn is connected to the second power source metal wiring 16vs. The third metal film may be made from copper (Cu), for example.

The semiconductor device 100D is exemplified by the buffer structured by connecting the inverters in two stages in series, and configured to minimize the active regions (the number of projection semiconductor layers) of the inverter in the former stage for the purpose of prolonging the delay time. The LIC of the inverter at the input side with the part in parallel with the gate electrode extending not only to the portion on the projection semiconductor layer but also to the portion without the projection semiconductor layer. As parasitic capacitance Cpe exists in the part where the LIC is disposed in parallel with the gate electrode, the parasitic capacitance may be increased by elongating the parallel driving distance. Therefore, unlike the second embodiment requiring change in the gate length or the third embodiment respiring increase in the number of inverters to be connected, this embodiment is capable of prolonging the delay time while keeping the same cell area. The inverter capacitance at the input side is doubled compared with the case where the LIC is disposed only on the projection semiconductor layer. Assuming that the delay time in the case of the structure having the LIC disposed only on the projection semiconductor layer is defined as Ta, the delay time of the inverter at the input side may be expressed by 2×Ta. Assuming that the delay time of the inverter at the output side is defined as Tb, the delay time in the case of the inverters in two stages may be expressed by 2×Ta+Tb. That is, it is possible to establish the delay time corresponding to Ta while keeping the same area. As the inverter at the input side has small number of Fins, the relationship of Ta>Tb is established. The use of the layout as described in the fourth embodiment allows the delay time corresponding to Ta to be prolonged by 1.5 or more times.

Furthermore, as the transistors employed for this embodiment are less than those employed for the third embodiment, less leak current is generated, which allows reduction in power consumption more than the case with the same delay time.

Fifth Embodiment

Figure 6A:
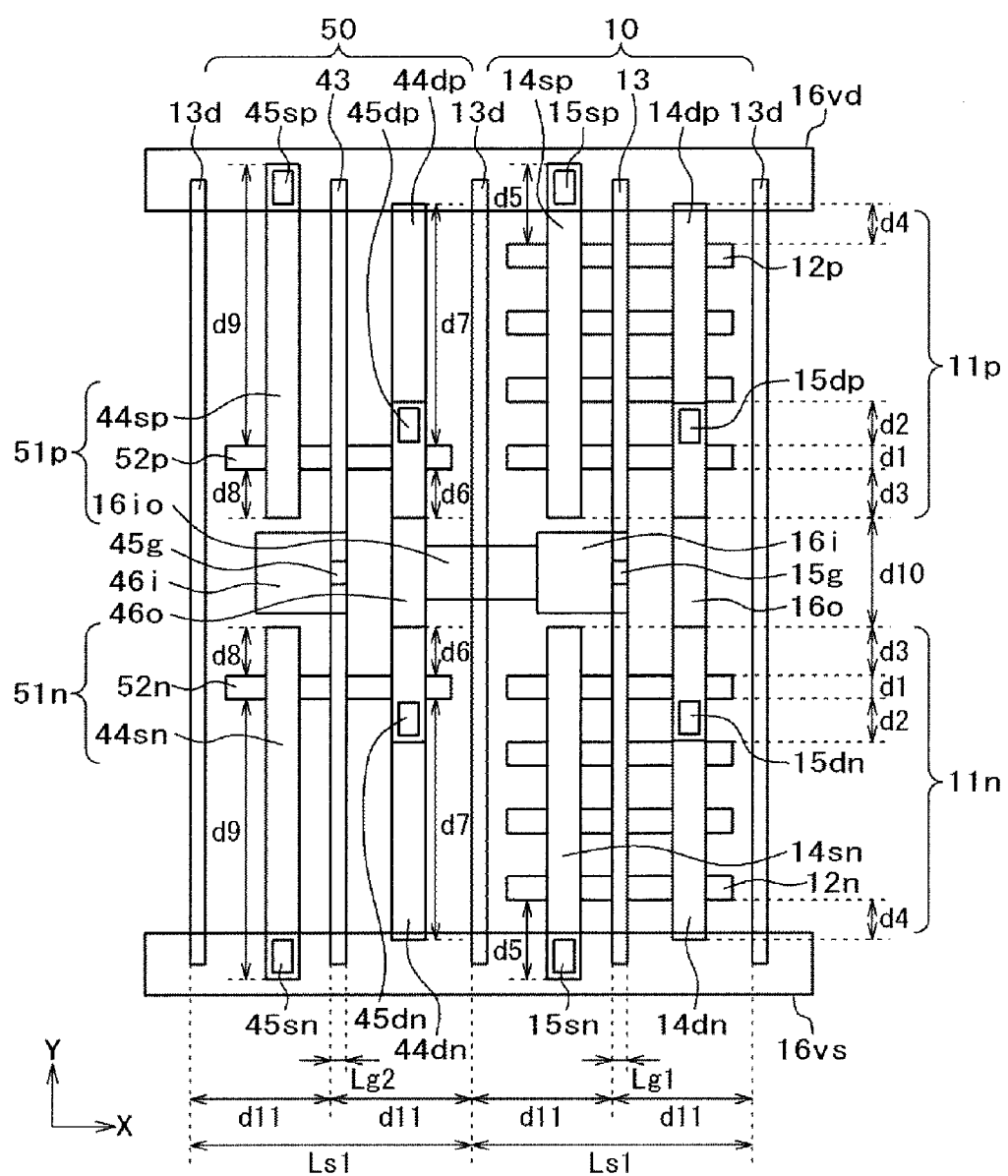
FIG. 6A is a plan view for explaining a semiconductor device according to a fifth embodiment.
Figure 6B:
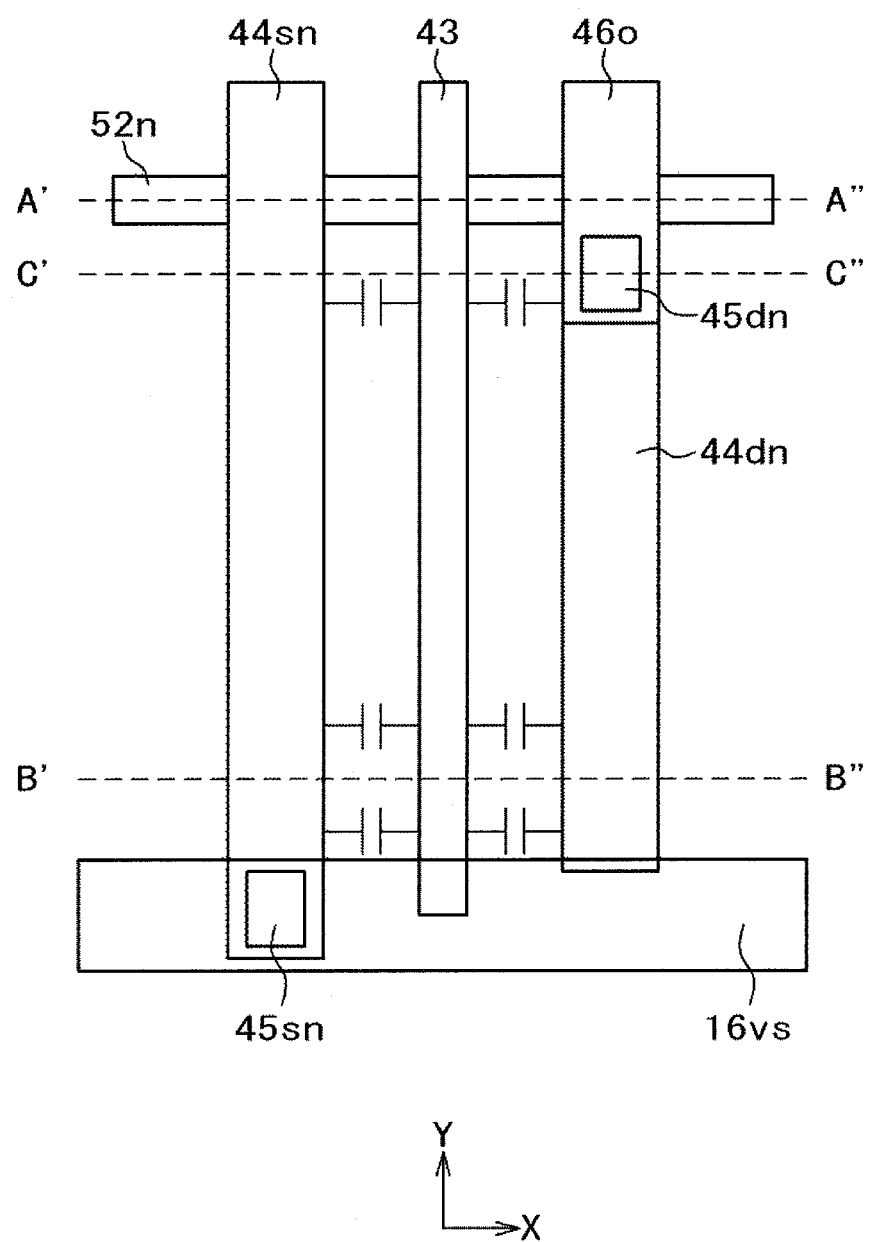
FIG. 6B is a plan view of an enlarged part of the structure shown In FIG. 6A.

A semiconductor device according to a fifth embodiment will be described referring to FIGS. 6A and 6B, which has the same delay time as that of the fourth embodiment. FIG. 6A is a plan view representing structure of the delay circuit according to the fifth embodiment. FIG. 6B is a plan view of an enlarged part of the structure shown in FIG. 6A.

A semiconductor device 100E according to the fifth embodiment is substantially the same as the semiconductor device according to the fourth embodiment except that the arrangement of the active regions of an inverter (second inverter) 50 at the input side is different. Sectional views taken along lines A'-A", B'-B", C'-C" of FIG. 6B are the same as those shown in FIGS. 5A, 5B, 5C, respectively.

A width of an active region 52p in a planar view is defined as d1, a distance between an end of the active region 52p and an end of the LIC 44dp at the side of the n-channel transistor 51n in a planar view is defined as d6, and a distance between an end of the active region 52p and an end of the LIC 44dp at the side of the first power source metal wiring 16vd in a planar view is defined as d7. A distance between an end of the active region 52p and an end of the LIC 44sp at the side of the n-channel transistor (second n-channel transistor) 51n in a planar view is defined as d8, and a distance between an end of the active region 52p and an end of the LIC 44sp at the side of the first power source metal wiring 16vd in a planar view is defined as d9.

A width of the active region 52n in a planar view is defined as d1, a distance between an end of the active region 52n and an end of the LIC 44dn at the side of the p-channel transistor 51p in a planar view is defined as d6, and a distance between an end of the active region 52n end an end of the LIC 44dn at the side of the second power source metal wiring 16vs in a planar view is defined as d7. A distance between an end of the active region 52n and an end of the LIC 44sn at the side of the p-channel transistor (second p-channel transistor) 51p in a planar view is defined as d8, and a distance between an end of the active region 52n and an end of the LIC 44sn at the side of the second power source metal wiring 16vs in a planar view is defined as d9.

The active region 52p is disposed on the same line with the active region 12p at the side farthest to the first power source metal wiring 16vd in X direction, and the active region 52n is disposed on the same line with the active region 12n at the side farthest to the second power source metal wiring 16vs in X direction so that the relationship is expressed by the formulae (4) to (10). In the case of the semiconductor device 100E, the relationships of d6 =d3, d8=d3 are established. Furthermore, the LIC 14dp has the same length as that of the LIC 44dp, the LIC 14sp has the same length as that of the LIC 44sp, the LIC 14dn has the same length as that of the LIC 44dn, and the LIC 14sn has the same length as that of the LIC 44sn for establishing the following relationships.

$$d7=(N-1)(d1+d2) \cdot d4 \tag{13}$$

$$d9=(N-1)(d1+d2)+d5 \tag{14}$$

In the case of the semiconductor device 100E, N=4 is set.

Accordingly, the d7 becomes longer than the d4, and the d9 becomes longer than the d5, resulting in the length longer than the corresponding part of the semiconductor device 100A.

The number of the active regions 12p is not limited to four so long as it is larger than the number of the active regions 52p. The number of the active regions 12n is not limited to four so long as it is larger than the number of the active regions 52n. The number of the active regions 52p is not limited to one so long as it is smaller than the number of the active regions 12p. The number of the active regions 52n is not limited to one so long as it is smaller than the number of the active regions 12n.

In spite of positional change of the active regions of the inverter at the input side, the delay time may be prolonged because of increase in the parasitic capacitance likewise the fourth embodiment.

The active region 52p does not have to be disposed on the same line with the active region 12p at the side farthest to the first power source metal wiring 16vd in X direction. It may be disposed at the position between the active regions 12p at the sides farthest and proximate to the first power source metal wiring 16vd. The active region 52n does not have to be disposed on the same line with the active region 12n at the side farthest to the second power source metal wiring 16vs in X direction. It may be disposed at the position between the active regions 12n at the sides farthest and proximate to the second power source metal wiring 16vs.

Sixth Embodiment

Figure 7A:
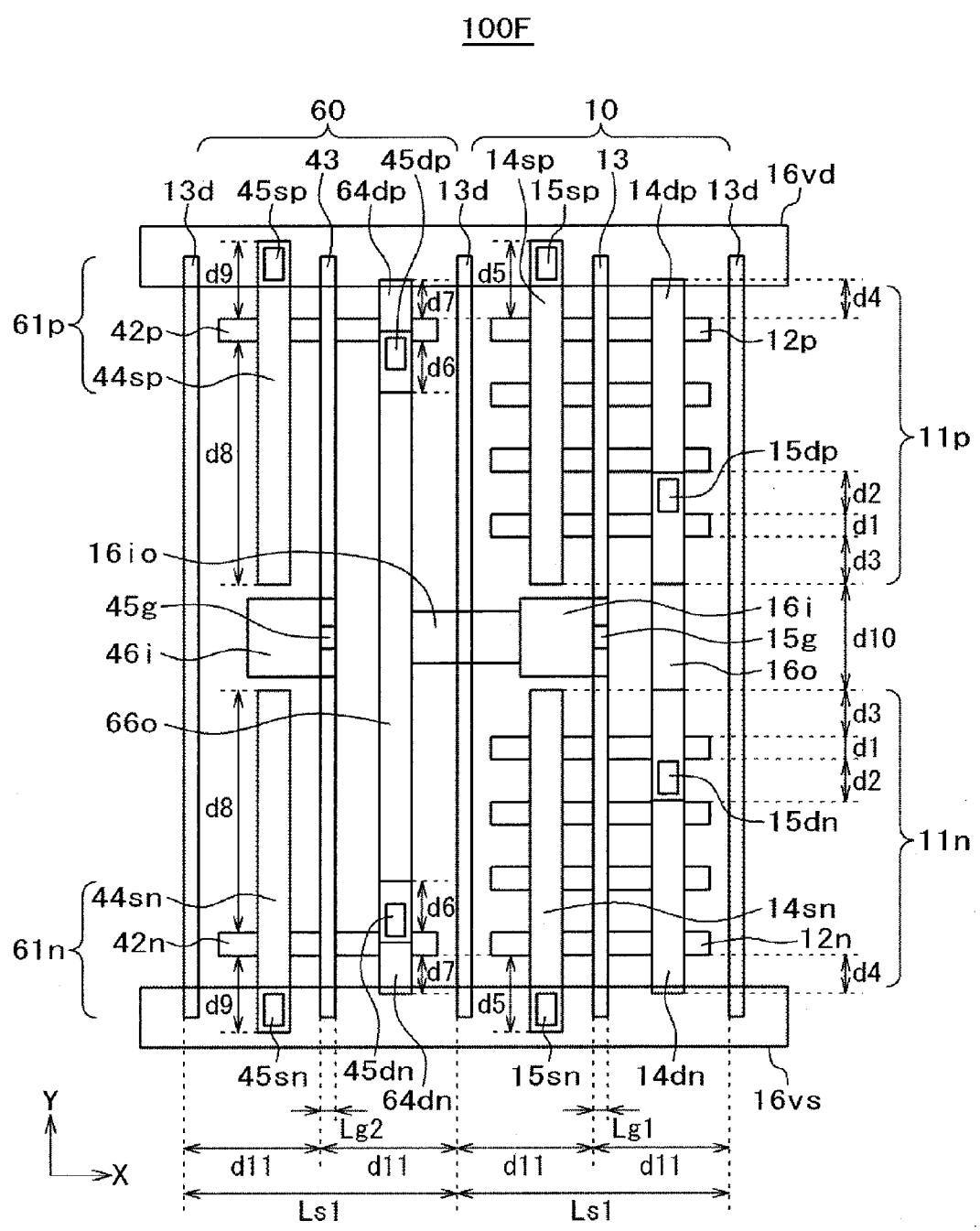
FIG. 7A is a plan view for explaining a semiconductor device according to a sixth embodiment.
Figure 7B:
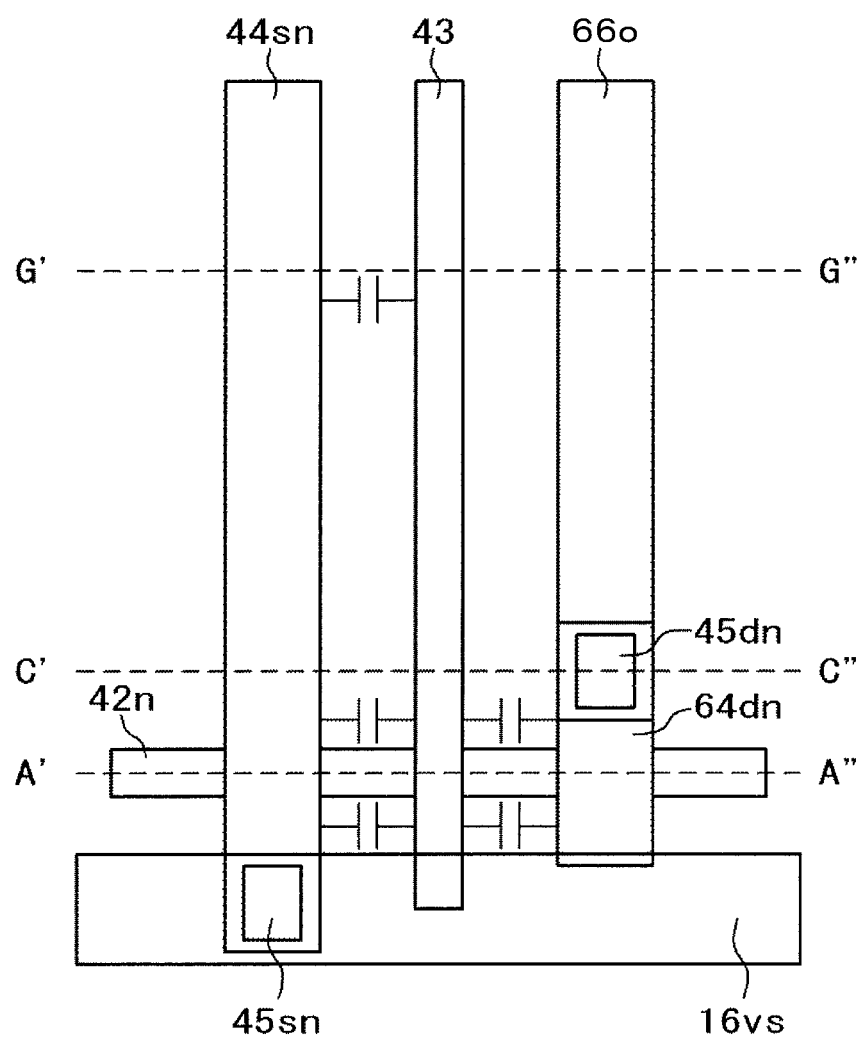
FIG. 7B is a plan view of an enlarged pact of the structure shown in FIG. 7A.
Figure 8:
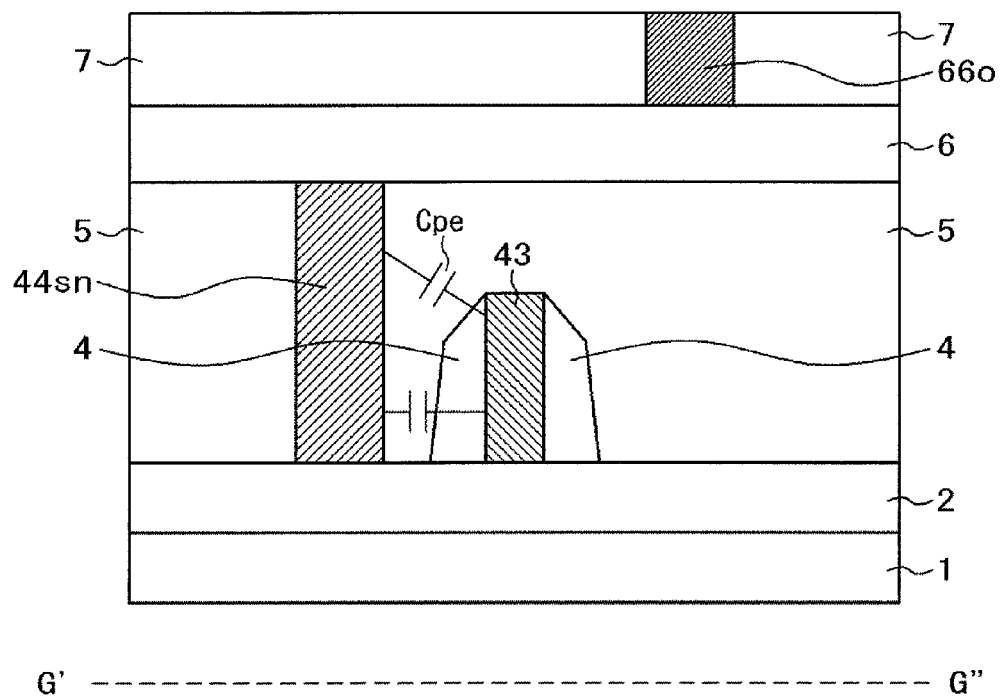
FIG. 8 is a sectional view taken along Line G'-G" of FIG. 7B.

A semiconductor device according to a sixth embodiment will be described referring to FIGS. 7A, 7B, 8, which has the delay time shorter than the cases of the fourth and the fifth embodiments. FIG. 7A is a plan view representing structure of the semiconductor device according to the sixth embodiment. FIG. 7B is a plan view of an enlarged part of the structure shown in FIG. 7A. FIG. 8 is a sectional view taken along line G'-G" of FIG. 7B.

A semiconductor device 100F according to the sixth embodiment basically the same as the semiconductor device according to the first embodiment except that the LIC to be connected to the drain side active region of an inverter (second inverter) 60 at the input side has the different length. In the state where the length of the LIC is variable, sectional views taken, along lines A'-A" and C'-C" of FIG. 7B are analogical to those shown in FIGS. 5A and 5C, respectively.

A width of the active region 42p in a planar view is defined as d1, a distance between an end of the active region 42p and an end of an LIC 64dp at the side of an n-channel transistor 61n in a planar view is defined as d6, and a distance between an end of the active region 42p and en end of the LIC 64dp at the side of the first power source metal wiring 16vd in a planar view is defined as d7. A distance between an end of the active region 42p and an end of the LIC 44sp at the side of the n-channel transistor (second n-channel transistor) 61n a planar view is defined as d8, and a distance between an end of the active region 42p and an end of the LIC 44sp at the side of the first power source metal wiring 16vd in a planar view is defined as d9.

A width of the active region 42n in a planar view is defined as d1, a distance between an and of the active region 42n and an end of the LIC 64dn at the side of the p-channel transistor 41p in a planar view is defined as d6, and a distance between an end of the active region 42n and an end of the LIC 64dn at the side of the second power source metal wiring 16vs in a planar view is defined as d7. A distance between an end of the active region 42n and an and of the LIC 44sn at the side of the p-channel transistor (second p-channel transistor) 61p in a planar view is defined as d8, and a distance between an end of the active region 42n and an end of the LIC 44sn at the side of the second power source metal wiring 16vs in a planar view is defined as d9.

The active region 42p is disposed on the same line with the active region 12p at the side proximate to the first power source metal wiring 16vd in X direction, and the active region 42n is disposed on the same line with the active region 12n at the side proximate to the second power source metal wiring 16vs in X direction so that the relationship is expressed by the formulae (4) to (10). In the case of the semiconductor device 1F, the relationships of d6=d3, d7=d4, d9=d5 are established. Furthermore, the LIC 14sp has the same length as that of the LIC 44sp, and the LIC 14sn has the same length as that of the LIC 44sn for establishing the following relationship.

$$d8=(n-1)(d1+d2)+d3 \tag{12}$$

In the case of the semiconductor 100D, N=4 is set. Accordingly, the d8 becomes longer than the d3, resulting in the length longer than the corresponding part of the semiconductor device 100A.

The number of the active regions 12p is not limited to four so long as it is larger than the number of the active regions 42p. The number of the active regions 12n is not limited to four so long as it is larger than the number of the active regions 42n. The number of the active regions 42p is not limited to one so long as it is smaller than the number of the active regions 12p. The number of the active regions 42n is not limited to one so long as it is smaller than the number of the active regions 12n.

Consequently, as FIGS. 7B and 8 show, the LIC in parallel with most part of the gate electrode 43 at one side hardly exists. Then the parasitic capacitance (CPe) between the gate electrode and the LIC is reduced. The delay time of the CMOS inverter 60 at the input side is expressed as Ta+Ta/2, which is prolonged by Ta/2. Compared with the fourth embodiment, the delay time of the inverter at the input side is reduced by Ta/2.

According to the first, fourth, sixth embodiments, values of the d6 and d8 may be in the following range.

$$d3 \leq d6 \leq (N-1)(d1+d2)+d3 \tag{15}$$

$$d3 \leq d8 \leq (N-1)(d1+d2)+d3 \tag{16}$$

In the aforementioned range, d6=d8=d3 is established in the first embodiment, and d6=d8=(N−1)(d1+d2)+d3 is established in the fourth embodiment.

The delay time of the inverter at the input side may be adjusted in the range of (1.5-2) Ta by regulating the length of the LIC at the drain side of the active region. It is possible to reduce the length (d8) of the LIC to be connected to the source side of the active region. The delay time of the inverter at the input side may be adjusted in the range of (1-1.5) Ta by regulating the length of the LIC at the source side of the active region. The delay time of the inverter at the input side may be adjusted in the range of (1-2) Ta by regulating each length of the LIC both at the drain and source sides of the active region. The change in the LIC length as described above makes it possible to adjust the delay time while Keeping the same area of the inverter.

Seventh Embodiment

Figure 9A:
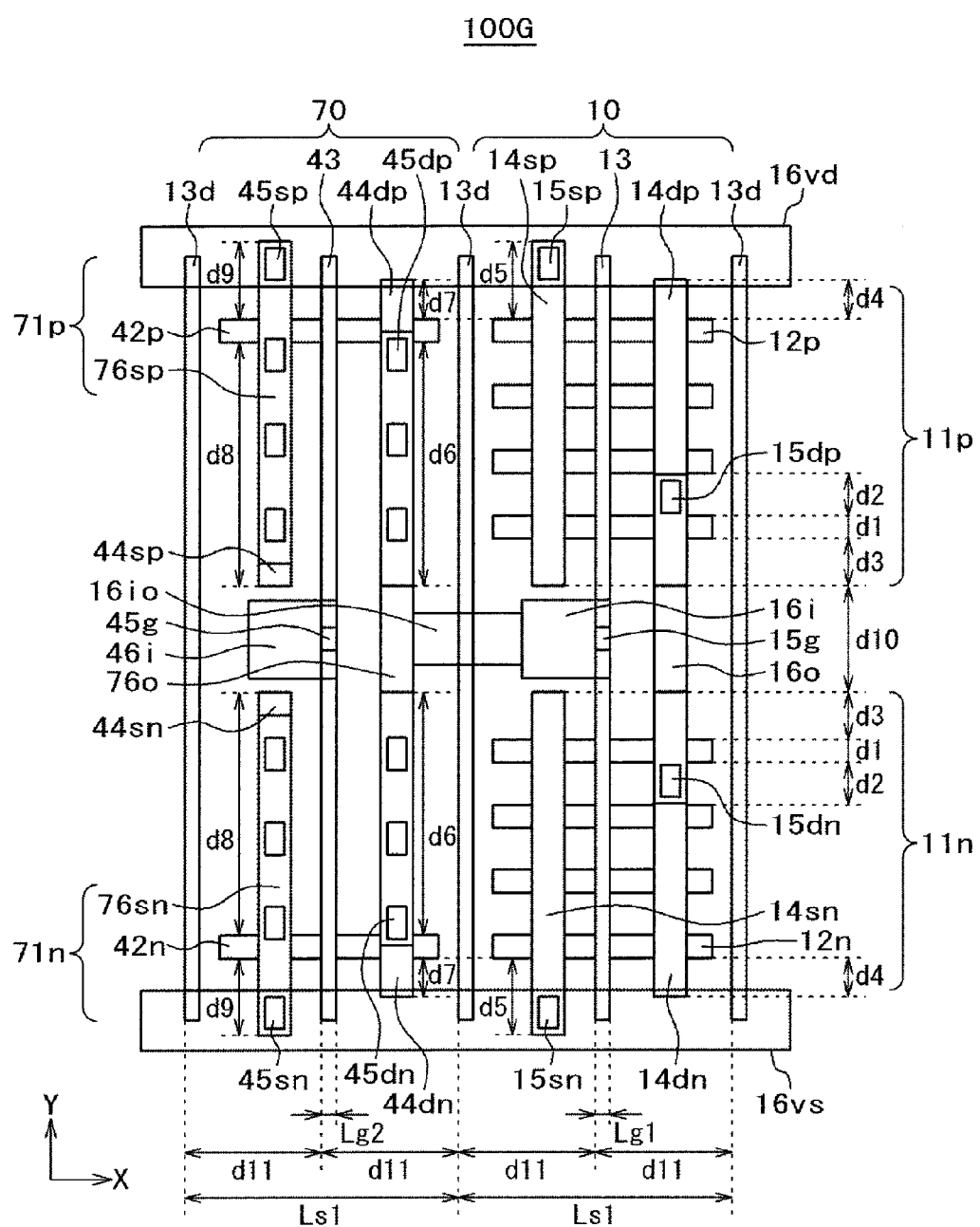
FIG. 9A is a plan view for explaining a semiconductor device according to a seventh embodiment.
Figure 9B:
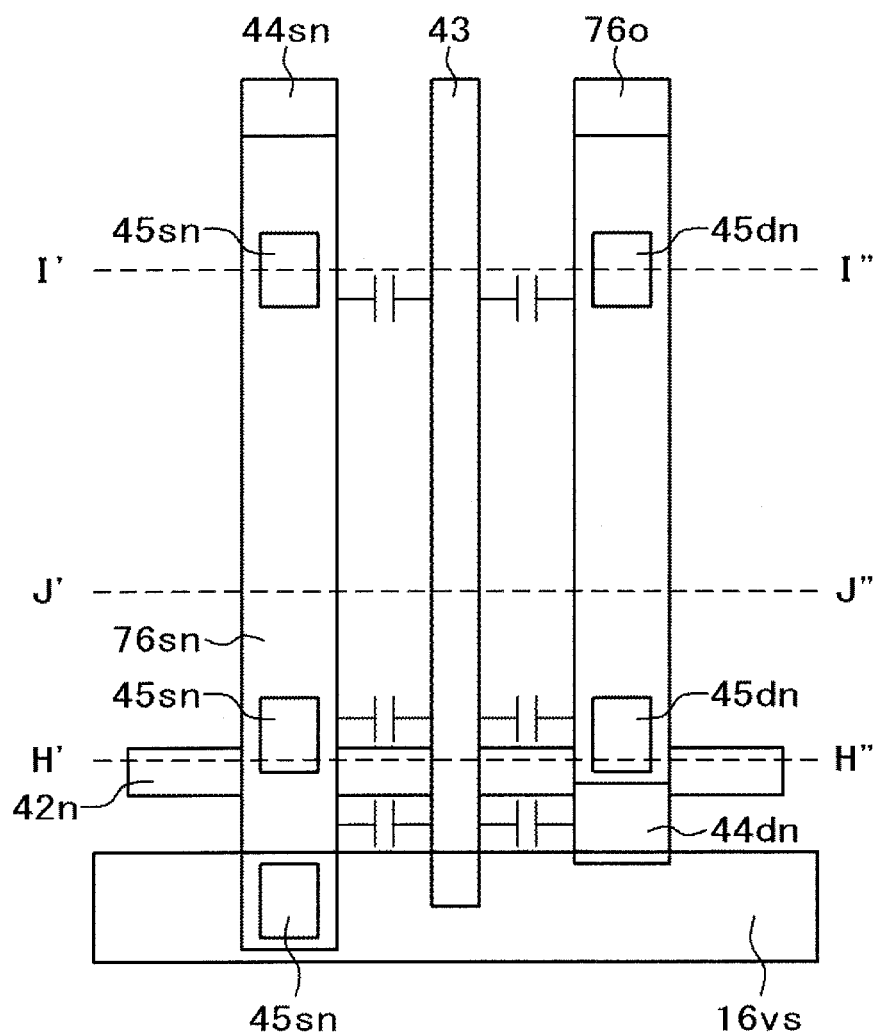
FIG. 9B is a plan view of an enlarged part of the structure shown in FIG. 9A.
Figure 10A:
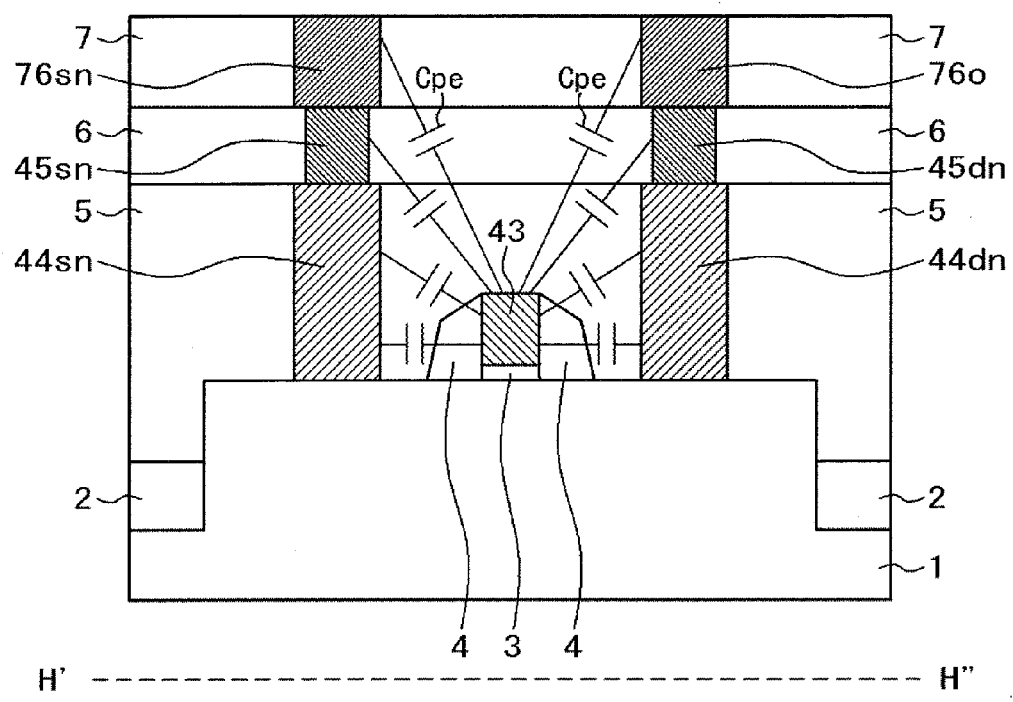
FIG. 10A is a sectional view taken along line H'-H" of FIG. 9B.
Figure 10B:
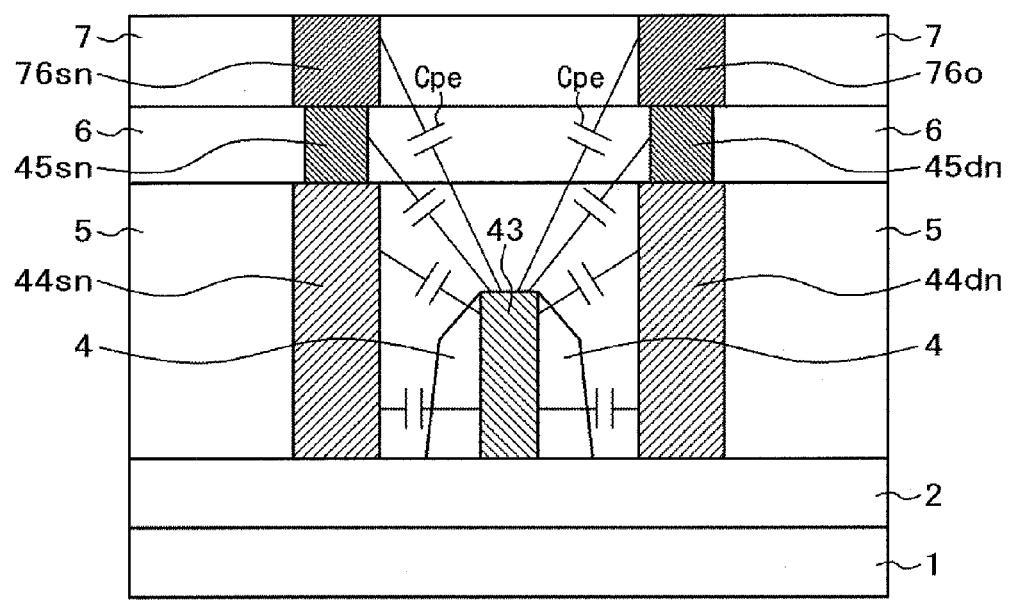
FIG. 10B is a sectional view taken along line I'-I" of FIG. 9B.
Figure 10C:
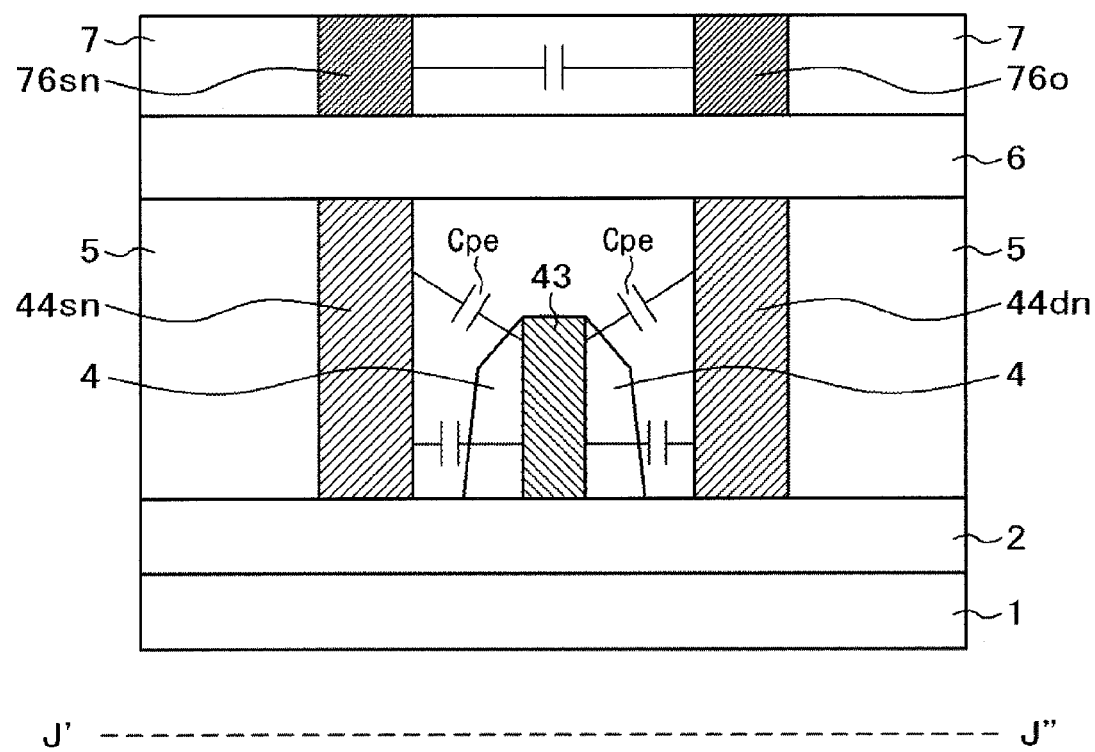
FIG. 10C is a sectional view taken along line J'-J" of FIG. 9B.

A semiconductor device according to a seventh embodiment will be described referring to FIGS. 9A, 9B, and 10A to 1C. FIG. 9A is a plan view representing structure of the semiconductor device according to the seventh embodiment. FIG. 9B is a plan view of an enlarged part of the structure shown in FIG. 9B. FIG. 10A is a sectional view taken along line H'-H" of FIG. 9B. FIG. 10B is a sectional view taken along line I'-I" of FIG. 9B. FIG. 10C is a sectional view taken along line J'-J" of FIG. 9B.

A semiconductor device 100G according to the seventh embodiment is basically the same as the semiconductor device 100D according to the fourth embodiment except the metal wiring as the upper layer of the LIC of an inverter (second inverter) 70 at the input side, and arrangement of the vias. In other words, values of d1 to d11 of the semiconductor device 100G are the same as those of the semiconductor device 100D.

An output metal wiring 76o is disposed so as to be layered on the LIC 44dp and the LIC 44dn. The output metal wiring 76o is connected to the LIC 44dp through a plurality of vias 45dp (three vias in the drawing), and is connected to the LIC 44dn through a plurality of vias 45dn (three vias in the drawing). A metal wiring 76sp to be connected to the first power source metal wiring 16vd is disposed so as to be layered on the LIC 44sp, and a metal wiring 76sn to be connected to the second power source metal wiring 16vs is disposed so as to be layered on the LIC 44sn. The LIC 44sp is connected to the metal wiring 76sp through a plurality of vias 45sp (four vias in the drawing), and the LIC 44sn is connected to the metal wiring 76sn through a plurality of vias 45dn (four vias in the drawing).

As FIGS. 10A, 10B, 10C show, the parasitic capacitance is newly generated between the metal wiring and the gate electrode, the via and the gate electrode, and the metal wirings, respectively. The resultant parasitic capacitance becomes greater then that of the fourth embodiment, thus prolonging the delay time. Increase in the number of the vias will further add the parasitic capacitance to the via capacity (between the via and the gate electrode, between the vias, between the via and the metal wiring). This makes it possible to prolong the delay time.

This embodiment is configured to increase the parasitic capacitance by adding the metal wirings and the vias to the structure according to the fourth embodiment. However, the aforementioned feature my be applied to the first, fifth, sixth, and eighth, embodiments.

Eighth Embodiment

Figure 11A:
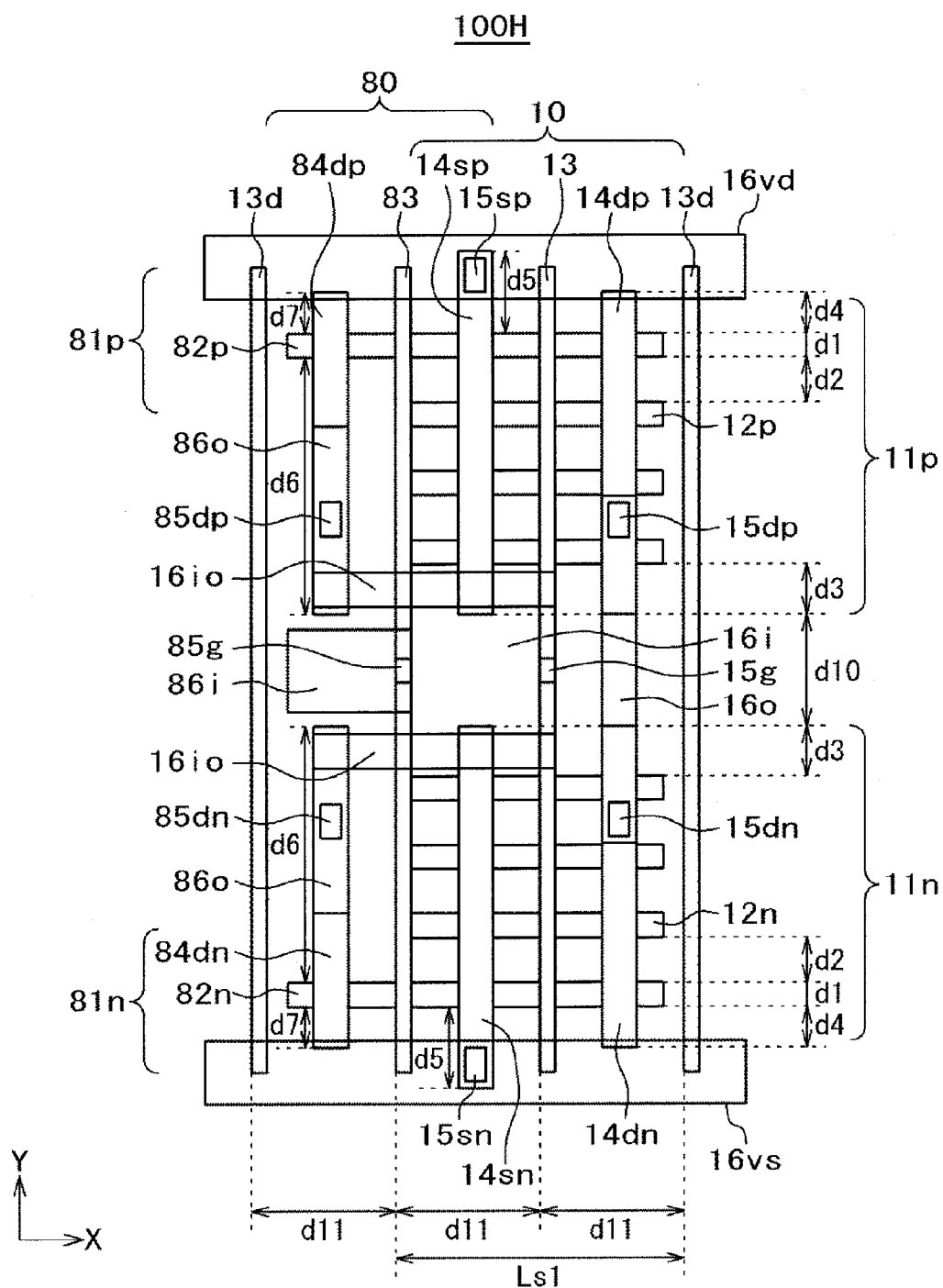
FIG. 11A is a plan view for explaining a semiconductor device according to an eighth embodiment.
Figure 11B:
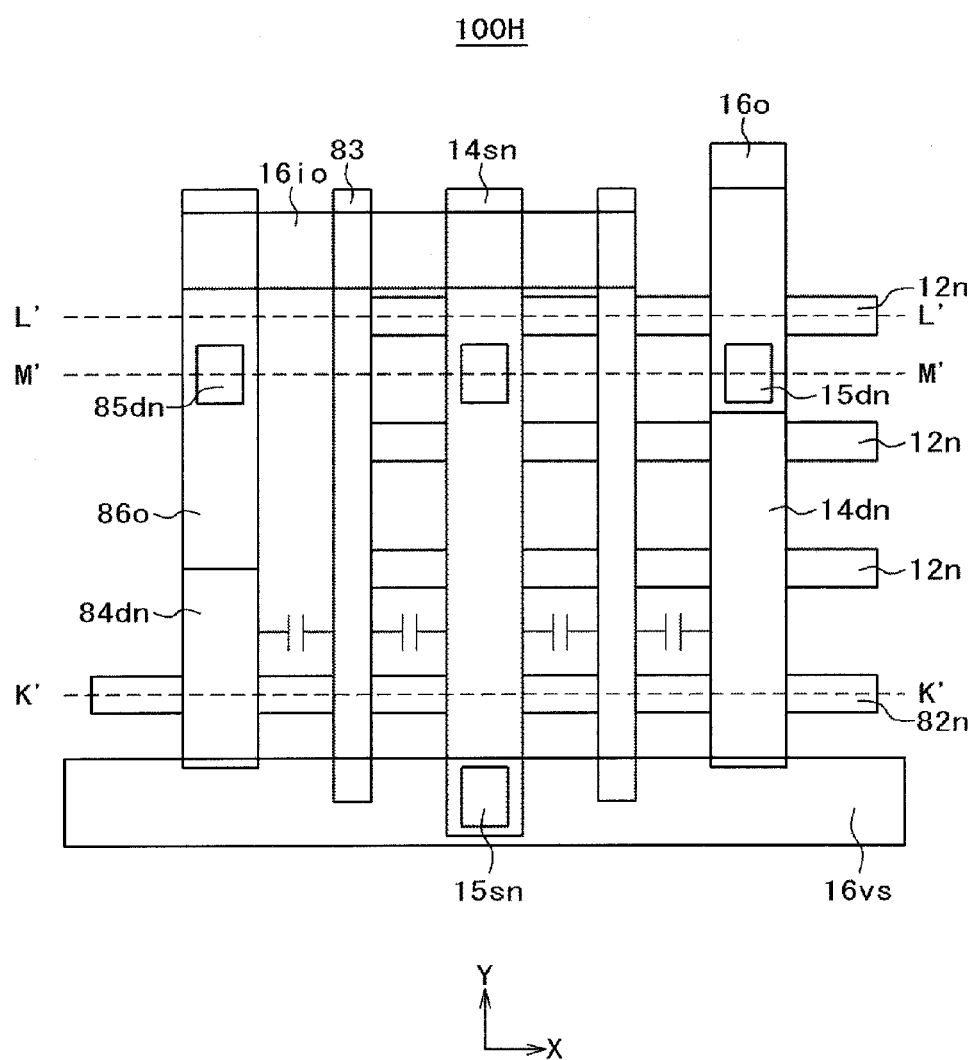
FIG. 11B is a plan view of an enlarged part of the structure shown in FIG. 11A.
Figure 12A:
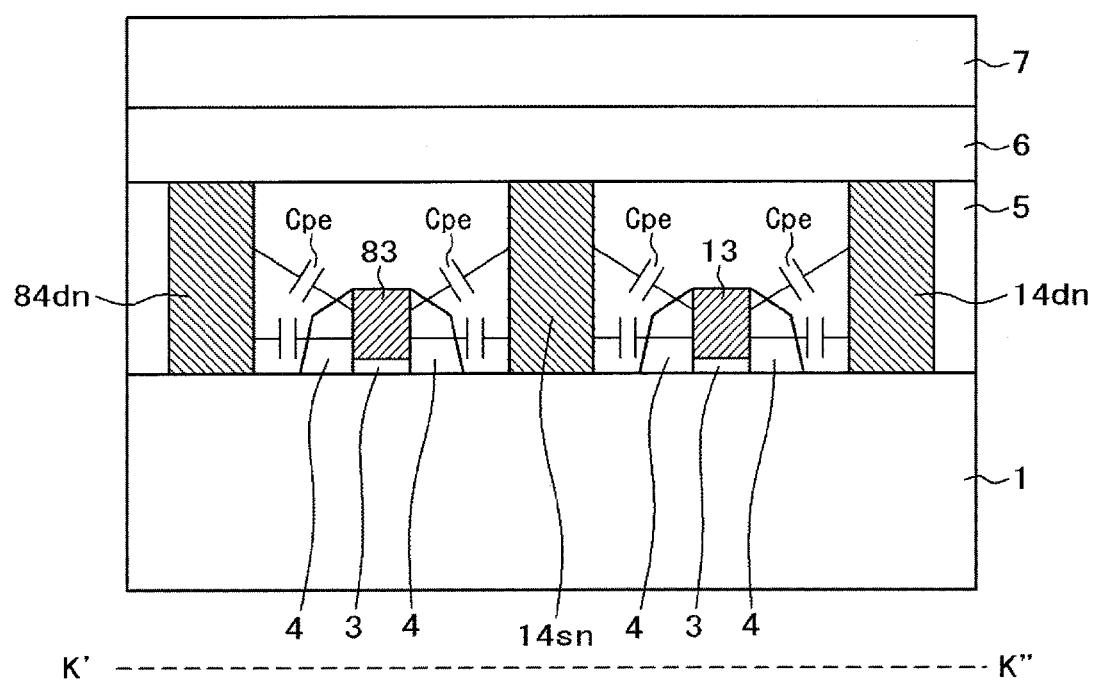
FIG. 12B is a sectional view taken along line K'-K" of FIG. 11B.
FIG. 12C is a sectional view taken along line L'-L" of FIG. 11B.
Figure 12B:
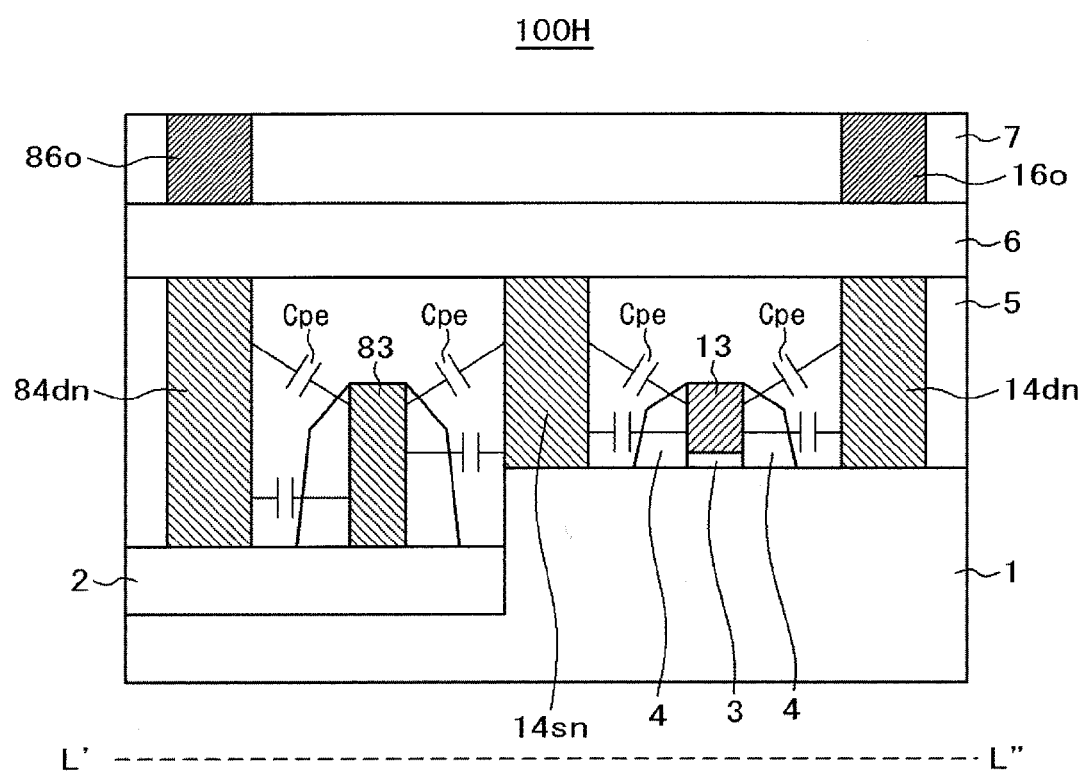
Figure 12C:
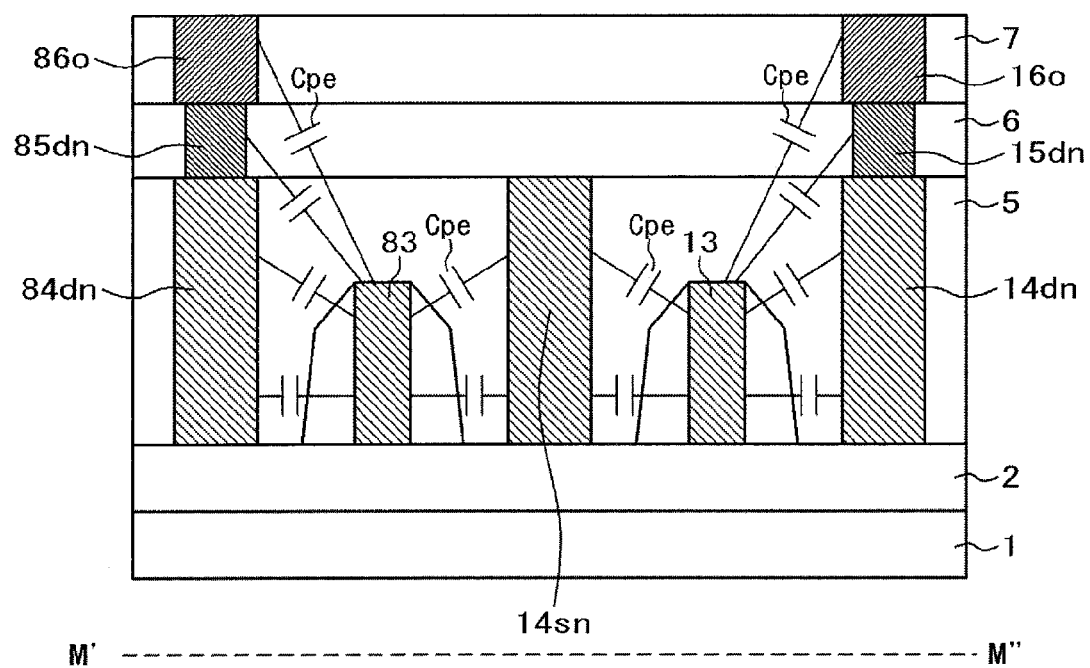

A semiconductor device according to an eighth embodiment will be described referring to FIGS. 11A, 11B, and 12A to 12C. FIG. 11A is a plan view representing structure of the semiconductor device according to the eighth embodiment. FIG. 11B is a plan view of an enlarged part of the structure shown in FIG. 11A. FIG. 12A is a sectional view taken along line K'-K" of FIG. 11B. FIG. 12B is a sectional view taken along line L'-L" of FIG. 11B. FIG. 12C is a sectional view taken along line M'-M'" of FIG. 11B.

Likewise the semiconductor device 100A according to the first embodiment as shown in FIG. 1B, a semiconductor device 100H according to the eighth embodiment is structured by connecting the inverters in two stages in series. The inverter 10 of the semiconductor device 100H at the output side has substantially the same structure as that of the inverter of the semiconductor device 100A at the output side, and an inverter (second inverter) 80 of the semiconductor device 100H is configured to share the source side LIC of the inverter at the output side.

The p-channel transistor 11p of the inverter 10 at the output side includes the active regions 12p constituted by the semiconductor layer with three Fin structures, an active region (first active region) 82p as the semiconductor layer with single Fin structure, and the gate electrode 13 which crosses those regions. The p-channel transistor 11p includes the LIC 14sp for connecting four active regions at the source side, which are connected to the first power source metal wiring 16vd, and the LIC 14dp for connecting four active regions at the drain side. The n-channel transistor 11n of the inverter 1 at the output side includes active regions 12n with three-Fin structure, and the gate electrode which crosses the active regions. The n-channel transistor 11n includes the LIC 14sn for connecting four active regions at the source side, which are connected to the second power source metal wiring 16vs, and an active region (second active region) 82n as the semiconductor layer with the single Fin structure, and the LIC 14dn for connecting four active regions at the drain side. The number of the active regions 82p is not limited to one, but my be set to, for example, two so long as it is smaller than the number of the active regions of the p-channel transistor 11p. In the case where the channel transistor 11p has four active regions, and two active regions 82p, the number of the active regions 12p becomes two. The number of the active regions 82n is not limited to one, but may be set to, for example, two so long as it is smaller than the number of the active regions of the n-channel transistor 11n. In the case where the n-channel transistor 11n has four active regions, and two active regions 82n, the number of the active regions 12n becomes two.

A p-channel transistor (second p-channel transistor) 81p of the inverter 80 at the input side includes an active region (third active region) 82p, and a gate electrode 83 which crosses the active region. The p-channel transistor 81p includes the LIC 14sp for connecting the source side of the active region 82p and the first power source metal wiring 16vd, and an LIC 84dp for connecting the drain side of the active region 82p and an output metal wiring 86o. The active region of the p-channel transistor is 81p is connected to one of the active regions of the p-channel transistor 11p. In the case of two active regions 82p of the p-channel transistor 81p, they are connected to the respective active regions of the p-channel transistor 11p.

An n-channel transistor (second n-channel transistor) 81n of the inverter 80 at the input side includes an active region (fourth active region) 82n, and the gate electrode 83 which crosses the active region. The n-channel transistor 81n includes an LIC 14sn for connecting the source side of the active region 82n and the second power supply metal wiring 16vs, and an LIC 84dn for connecting the drain side of the active region 82n and the output metal wiring 86o. The active region of the n-channel transistor 81n is connected to one of the active regions of the n-channel transistor 11n. In the case of two active regions 82n of the n-channel transistor 81n, they are connected to the respective active regions of the n-channel transistor 11n.

The gate electrode 83 and an input metal wiring 86i are connected through a via 85g, the LIC 84dp and the output metal wiring 86o are connected through a via 85dp, the LIC 84dn and the output metal wiring 86o are connected through a via 85dn so that the p-channel transistor 81p and the n-channel transistor 81n are connected. The output metal wiring 86o and the input metal wiring 16i are connected through the connection metal wiring 16io so that the input side inverter 80 and the output side inverter 10 are connected. The semiconductor device 100H includes dummy gate electrodes 13d each with the same size as the gate electrode on the same layer, which is kept unconnected. The number of the dummy gate electrodes is smaller than the number of those electrodes in other embodiments by one. The potential applied to the first power source metal wiring 16vd is higher than the one applied to the second power source metal wiring 16vs.

Values of d1 to d7, d10 and d11 of the semiconductor device 100H are the same as those of the semiconductor device 100D. As the source side LICs are shared by the inverters 10 and 80, d8 and d9 do not exist.

As FIGS. 12A to 12C show, likewise each parasitic capacitance between the gate electrode 13 and the LIC 14dn, the gate electrode 13 and the LIC 14sn, the gate electrode 83 and the via 15dn, and the gate electrode 13 and the output metal wiring 16o, each parasitic capacitance between the gate electrode 83 and the LIC 84dn, the gate electrode 83 and the LIC 14sn, the gate electrode 83 and the via 85dn, and the gate electrode 83 and the output metal wiring 86o will be added so that the delay time of the inverter 80 is substantially the same as that of the fourth embodiment.

The active region 82p does not have to be disposed at the side proximate to the first power source metal wiring 16vd, but may be disposed at the position between the active regions 12p at the sides farthest and proximate to the first power source metal wiring 16vd. The active region 82n does not have to be disposed at the side proximate to the second power source metal wiring 16vs, but may be disposed at the position between the active regions 12n at the sides farthest and proximate to the second power source metal wiring 16vs. Each number of the vias 85dp and 85dn is not limited to one, but a plurality of vias may be provided as described in the seventh embodiment.

The semiconductor device 100H is configured that the LICs to be connected to the first and the second power sources are shared by the inverters 10 and 80. This makes it possible to reduce the distance in X direction, thus decreasing the cell area.

The present invention has been described, taking the embodiments as examples. However, it is to be understood that the present invention is not limited to those embodiments, but may be modified into various forms within the scope of the present invention.

What is claimed is:

1. A semiconductor device comprising a first inverter, and a second inverter connected to the first inverter in series, wherein:
the first inverter includes a first p-channel transistor and a first n-channel transistor;
the second inverter includes a second p-channel transistor and a second n-channel transistor;
the first p-channel transistor includes a first active region in the form of a projection semiconductor layer, extending along a first direction, a first gate electrode extending along a second direction, a first local connection wiring extending along the second direction so as to be connected to a source side of the first active region, and a second local connection wiring extending along the second direction so as to be connected to a drain side of the first active region;
the first n-channel transistor includes a second active region in the form of the projection semiconductor layer, extending along the first direction, the first gate electrode extending along the second direction, a third local connection wiring extending along the second direction so as to be connected to a source side of the second active region, and a fourth local connection wiring extending along the second direction so as to be connected to a drain side of the second active region;
the second p-channel transistor includes a third active region in the form of the projection semiconductor layer, extending along the first direction, a second gate electrode extending along the second direction, a fifth local connection wiring extending along the second direction so as to be connected to a source side of the third active region, and a sixth local connection wiring extending along the second direction so as to be connected to a drain side of the third active region;

the second n-channel transistor includes a fourth active region in the form of the projection semiconductor layer, extending along the first direction, the second gate electrode extending along the second direction, a seventh local connection wiring extending along the second direction so as to be connected to a source side of the fourth active region, and an eighth local connection wiring extending along the second direction so as to be connected to a drain side of the fourth active region;

the first local connection wiring and the fifth local connection wiring are connected to a first power source wiring;

the third local connection wiring and the seventh local connection wiring are connected to a second power source wiring;

the second local connection wiring is connected to the fourth local connecting wiring;

the number of the third active regions is smaller than the number of the first active regions; and the number of the fourth active regions is smaller than the number of the second active regions.

2. The semiconductor device according to claim 1, wherein a length (d8) of a part of the fifth local connection wiring between the third active region of the second p-channel transistor and the fourth active region of the second n-channel transistor, which are adjacent to each other, is longer than a length (d3) of a part of the first local connection wiring between the first active region of the first p-channel transistor and the second active region of the first n-channel transistor, which are adjacent to each other in plan view.

3. The semiconductor device according to claim 2, wherein a length (d8A) of a part of the seventh local connection wiring between the third active region of the second p-channel transistor and the fourth active region of the second n-channel transistor, which are adjacent to each other, is longer than a length (d3A) of a part of the third local connection wiring between the first active region of the first p-channel transistor and the second active region of the first n-channel transistor, which are adjacent to each other in plan view.

4. The semiconductor device according to claim 2, wherein a length (d6) of a part of the sixth local connection wiring between the third active region of the second p-channel transistor and the fourth active region of the second n-channel transistor, which are adjacent to each other, is longer than a length (d3B) of a part of the second local connection wiring between the first active region of the first p-channel transistor and the second active region of the first n-channel transistor, which are adjacent to each other in plan view.

5. The semiconductor device according to claim 4, wherein a length (d6A) of a part of the eighth local connection wiring between the third active region of the second p-channel transistor and the fourth active region of the second n-channel transistor, which are adjacent to each other, is longer than a length (d3C) of a part of the fourth local connection wiring between the first active region of the first p-channel transistor and the second active region of the first n-channel transistor, which are adjacent to each other in plan view.

6. The semiconductor device according to claim 2, wherein the first and second power source wirings extend along the first direction.

7. The semiconductor device according to claim 2, further comprising:

a first metal wiring extending along the second direction from the first power source wiring toward the second n-channel transistor; and a second metal wiring extending along the second direction from the second power source wiring toward the second p-channel transistor, wherein:

the first metal wiring is disposed to be layered on the fifth local connection wiring in plan view so as to be connected to the fifth local connection wiring through a via; and the second metal wiring is disposed to be layered on the seventh local connection wiring in plan view so as to be connected to the seventh local connection wiring through a via.

8. The semiconductor device according to claim 7, further comprising a third metal wiring for connecting the sixth and the eighth local connection wirings, which are connected to the first gate electrode.

9. The semiconductor device according to claim 8, wherein the third metal wiring is disposed to be layered on the sixth and the eighth local connection wirings in plan view so as to be connected to the sixth and the eighth local connection wirings through a via.

10. The semiconductor device according to claim 2, wherein $d8 \leq (N-1)(d1+d2)+d3$ is established, where N denotes the number of the first active regions of the first p-channel transistor, 1 denotes the number of the third active regions of the second p-channel transistor, d1 denotes a width of one of the first active regions in plan view, and d2 denotes a distance between an adjacent pair of the first active regions.

11. The semiconductor device according to claim 4, wherein $d6 \leq (N-1)(d1+d2)+d3B$ is established, where N denotes the number of the first active regions of the first p-channel transistor, 1 denotes the number of the third active regions of the second p-channel transistor, d1 denotes a width of one of the first active regions in plan view, and d2 denotes a distance between an adjacent pair of the first active regions.

12. The semiconductor device according to claim 1, wherein:

the first active region of the first p-channel transistor, the second active region of the first n-channel transistor, the third active region of the second p-channel transistor, and the fourth active region of the second n-channel transistor are disposed between the first and the second power source wirings extending along the first direction in plan view; and a length (d9) of the fifth local connection wiring extending toward the first power source wiring from an end of the third active region of the second p-channel transistor adjacent to the first power source wiring is longer than a length (d5) of the first local connection wiring extending toward the first power source wiring from an end of the first active region of the first p-channel transistor adjacent to the first power source wiring in plan view.

13. The semiconductor device according to claim 12, wherein a length (d7) of the sixth local connection wiring extending toward the first power source wiring from an end of the third active region of the second p-channel transistor adjacent to the first power source wiring is longer than a length (d4) of the second local connection wiring extending toward the first power source wiring from an end of the first active region of the first p-channel transistor adjacent to the first power source wiring in plan view.

14. The semiconductor device according to claim 12, wherein $d9=(N-1)(d1+d2)+d5$ is established, where N denotes the number of the first active regions of the first p-channel transistor, 1 denotes the number of the third active regions of the second p-channel transistor, d1 denotes a width of one of the first active regions in plan view, and d2 denotes a distance between an adjacent pair of the first active regions.

15. The semiconductor device according to claim 13, wherein $d7=(N-1)(d1+d2)+d4$ is established, where N denotes the number of the first active regions of the first p-channel transistor, 1 denotes the number of the third active regions of the second p-channel transistor, d1 denotes a width of one of the first active regions in plan view, and d2 denotes a distance between an adjacent pair of the first active regions.

16. The semiconductor device according to claim 1, wherein:
the third active region is connected to the first active region;
the fourth active region is connected to the second active region;
the first local connection wiring is connected to the source side of the third active region;
the third local connection wiring is connected to the source side of the fourth active region;
the second gate electrodes are disposed at positions between the first and the sixth local connection wirings, and between the third and the eighth local connection wirings in plan view; and
a length (d6B) of a part of the sixth local connection wiring between the third active region of the second p-channel transistor and the fourth active region of the second n-channel transistor, which are adjacent to each other is longer than a length (d3D) of the second local connection wiring between the first active region of the first p-channel transistor and the second active region of the first n-channel transistor, which are adjacent to each other in plan view.

17. The semiconductor device according to claim 16, wherein a length (d6C) of a part of the eighth local connection wiring between the third active region of the second p-channel transistor and the fourth active region of the second n-channel transistor, which are adjacent to each other is longer than a length (d3E) of a part of the fourth local connection wiring between the first active region of the first p-channel transistor and the second active region of the first n-channel transistor, which are adjacent to each other in plan view.

18. The semiconductor device according to claim 16, wherein the first and second power source wirings extend along the first direction.

19. The semiconductor device according to claim 16, wherein $d6B \leq (N-1)(d1+d2)+d3D$ is established, where N denotes the number of the first active regions of the first p-channel transistor, 1 denotes the number of the first active regions of the second p-channel transistor, d1 denotes a width of one of the first active regions in plan view, and d2 denotes a distance between an adjacent pair of the first active regions.

20. The semiconductor device according to claim 1, wherein:
the second gate electrode and the sixth local connection wiring are arranged between the first local connection wiring and the fifth local connection wiring in plan view, and
the second gate electrode and the eighth local connection wiring are arranged between the third local connection wiring and the seventh local connection wiring in plan view.

21. The semiconductor device according to claim 1, wherein the sixth local connection wiring and the eighth local connection wiring are connected to the first gate electrode.

* * * * *